US012332575B2

(12) United States Patent
Iwamoto et al.

(10) Patent No.: US 12,332,575 B2
(45) Date of Patent: Jun. 17, 2025

(54) TARGET SUPPLY SYSTEM, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventors: Fumio Iwamoto, Oyama (JP); Atsushi Ueda, Oyama (JP); Takayuki Yabu, Oyama (JP)

(73) Assignee: Gigaphoton Inc., Tochigi (JP)

( * ) Notice: Subject to any disclaimer, the term of this patent is extended or adjusted under 35 U.S.C. 154(b) by 143 days.

(21) Appl. No.: 18/149,998

(22) Filed: Jan. 4, 2023

(65) Prior Publication Data
US 2023/0266677 A1 Aug. 24, 2023

(30) Foreign Application Priority Data

Feb. 18, 2022 (JP) .................................. 2022-023467

(51) Int. Cl.
G03F 7/00 (2006.01)
G03F 1/24 (2012.01)
H05G 2/00 (2006.01)

(52) U.S. Cl.
CPC ............ *G03F 7/70741* (2013.01); *G03F 1/24* (2013.01); *G03F 7/70033* (2013.01); *G03F 7/70841* (2013.01); *H05G 2/0027* (2024.08)

(58) Field of Classification Search
CPC ...... H05G 2/002; H05G 2/0023; H05G 2/005; H05G 2/006; H05G 2/008; H05G 2/0082; G03F 7/70033
See application file for complete search history.

(56) References Cited

U.S. PATENT DOCUMENTS 9,699,876 B2 * 7/2017 Vaschenko ............. H05G 2/005
2006/0192155 A1 * 8/2006 Algots ................... H05G 2/006
250/504 R
(Continued)

FOREIGN PATENT DOCUMENTS

JP 2000091095 A * 3/2000
JP 2010-123405 A 6/2010
(Continued)

OTHER PUBLICATIONS

Machin translation of JP-2000091095-A (Year: 2000).*
(Continued)

*Primary Examiner* — Steven H Whitesell
(74) *Attorney, Agent, or Firm* — Studebaker Brackett PLLC

(57) ABSTRACT

A target supply system includes a load lock chamber configured to contain a solid target substance, a solid target supply pipe connected to the load lock chamber, a pressure regulator configured to regulate an externally supplied gas pressure, a gas pressure supply pipe connected to the pressure regulator, a melting tank connected to both the solid target supply pipe and the gas pressure supply pipe, and configured to melt the solid target substance supplied from the load lock chamber via the solid target supply pipe to generate a liquid target substance, a nozzle configured to discharge the liquid target substance by a gas pressure supplied from the pressure regulator to the melting tank via the gas pressure supply pipe, and a buffer tank configured to communicate with the melting tank and supply a gas pressure thereto when the solid target substance is supplied to the melting tank.

18 Claims, 15 Drawing Sheets

(56) References Cited

U.S. PATENT DOCUMENTS

| | | | | |
|---|---|---|---|---|
| 2009/0218522 A1* | 9/2009 | Nakano | .................. | H05G 2/008 |
| | | | | 250/504 R |
| 2010/0143202 A1* | 6/2010 | Yabu | ...................... | H05G 2/003 |
| | | | | 422/111 |
| 2010/0149505 A1* | 6/2010 | Sewell | ................ | G03F 7/70208 |
| | | | | 250/559.4 |
| 2010/0213272 A1* | 8/2010 | Yabu | ...................... | H05G 2/005 |
| | | | | 239/102.1 |
| 2010/0213275 A1* | 8/2010 | Ishihara | ................ | H05G 2/008 |
| | | | | 239/102.2 |
| 2014/0146297 A1* | 5/2014 | Vainer | ...................... | G03F 1/84 |
| | | | | 250/226 |
| 2016/0377986 A1* | 12/2016 | Shiraishi | ............... | H01L 21/027 |
| | | | | 355/67 |
| 2017/0350745 A1* | 12/2017 | Nagano | ................ | H01L 21/027 |
| 2021/0364927 A1 | 11/2021 | Hori et al. | | |

FOREIGN PATENT DOCUMENTS

| | | | |
|---|---|---|---|
| JP | 5662515 B2 * | 1/2015 | |
| WO | 2020/141057 A1 | 7/2020 | |

OTHER PUBLICATIONS

Machine translation of JP-5662515-B2 (Year: 2015).*
A Search Report issued by the Netherlands Patent Office on Feb. 28, 2025, which corresponds to Dutch Patent Application No. 2033930 and is related to U.S. Appl. No. 18/149,998.

* cited by examiner

FIG. 3

| S11 | VALVES VT1, VT2, V1, V2, V5, V6, V7 ARE CLOSED |
|---|---|
| S12 | OPEN VALVE V1 AND REGULATE INSIDE OF MELTING TANK C3 TO HIGH PRESSURE |
| S14 | PROCEED TO NEXT STEP AFTER CERTAIN TIME PERIOD ELAPSES |
| S21 | OPEN VALVE VT1 |
| S22 | MEASURE AMOUNT OF SOLID TARGET SUBSTANCE 27a |
| S23 | CLOSE VALVE VT1 |
| S31 | ACTIVATE EXHAUST PUMP 63 AND OPEN VALVE V6 |
| S32 | CLOSE VALVE V6 AND STOP EXHAUST PUMP 63 |
| S33 | OPEN VALVE V5 AND THEN CLOSE VALVE V5 |
| S41 | CLOSE VALVE V1 |
| S42 | OPEN VALVE V2 AND REGULATE INSIDE OF LOAD LOCK CHAMBER TO HIGH PRESSURE |
| S43 | OPEN VALVE V1 |
| S51 | OPEN VALVE VT2 |
| S53 | CLOSE VALVE VT2 |
| S61 | CLOSE VALVE V2 |
| S62 | OPEN VALVE V7 |
| S63 | CLOSE VALVE V7 |
| S64 | RETURN TO S14 |

FIG. 7

| S11a | VALVES VT1, VT2, V1, V2, V4, V5, V6, V7 ARE CLOSED |
|---|---|
| S12 | OPEN VALVE V1 AND REGULATE INSIDE OF MELTING TANK C3 TO HIGH PRESSURE |
| S13a | OPEN VALVE V4 WHEN INSIDE OF MELTING TANK C3 REACHES TARGET GAS PRESSURE |
| S14 | PROCEED TO NEXT STEP AFTER CERTAIN TIME PERIOD ELAPSES |
| S21 | OPEN VALVE VT1 |
| S22 | MEASURE AMOUNT OF SOLID TARGET SUBSTANCE 27a |
| S23 | CLOSE VALVE VT1 |
| S31 | ACTIVATE EXHAUST PUMP 63 AND OPEN VALVE V6 |
| S32 | CLOSE VALVE V6 AND STOP EXHAUST PUMP 63 |
| S33 | OPEN VALVE V5 AND THEN CLOSE VALVE V5 |
| S41 | CLOSE VALVE V1 |
| S42 | OPEN VALVE V2 AND REGULATE INSIDE OF LOAD LOCK CHAMBER TO HIGH PRESSURE |
| S43 | OPEN VALVE V1 |
| S51 | OPEN VALVE VT2 |
| S53 | CLOSE VALVE VT2 |
| S61 | CLOSE VALVE V2 |
| S62 | OPEN VALVE V7 |
| S63 | CLOSE VALVE V7 |
| S64 | RETURN TO S14 |

| BEFORE TEMPERATURE DROP | | |
|---|---|---|
| | MELTING TANK C3 | BUFFER TANK 64 |
| GAS PRESSURE | Pt | Pt |
| VOLUME | Vbh | Vbr |
| MOL NUMBER | n1 | n2 |
| TEMPERATURE | Tt | Tr |
| AFTER TEMPERATURE DROP | | |
| | MELTING TANK C3 | BUFFER TANK 64 |
| GAS PRESSURE | P | P |
| VOLUME | Vbh | Vbr |
| MOL NUMBER | n10 | n20 |
| TEMPERATURE | Tt−ΔT | Tr |

FIG. 17

| | |
|---|---|
| S11b | VALVES VT1, VT2, V1, V2, V4, V5, V6, V7 ARE CLOSED ADJUSTMENT MECHANISM 66 IS SET TO FIRST STATE |
| S12 | OPEN VALVE V1 AND REGULATE INSIDE OF MELTING TANK C3 TO HIGH PRESSURE |
| S13a | OPEN VALVE V4 WHEN INSIDE OF MELTING TANK C3 REACHES TARGET GAS PRESSURE |
| S14b | PROCEED TO NEXT STEP WHEN LIQUID LEVEL IN MELTING TANK C3 BECOMES LOWER THAN PREDETERMINED POSITION |
| S21 | OPEN VALVE VT1 |
| S22 | MEASURE AMOUNT OF SOLID TARGET SUBSTANCE 27a |
| S23 | CLOSE VALVE VT1 |
| S31 | ACTIVATE EXHAUST PUMP 63 AND OPEN VALVE V6 |
| S32 | CLOSE VALVE V6 AND STOP EXHAUST PUMP 63 |
| S33 | OPEN VALVE V5 AND THEN CLOSE VALVE V5 |
| S41 | CLOSE VALVE V1 |
| S42 | OPEN VALVE V2 AND REGULATE INSIDE OF LOAD LOCK CHAMBER TO HIGH PRESSURE |
| S43 | OPEN VALVE V1 |
| S51 | OPEN VALVE VT2 |
| S52b | SET ADJUSTMENT MECHANISM 66 TO SECOND STATE |
| S53 | CLOSE VALVE VT2 |
| S54b | SET ADJUSTMENT MECHANISM 66 TO FIRST STATE |
| S61 | CLOSE VALVE V2 |
| S62 | OPEN VALVE V7 |
| S63 | CLOSE VALVE V7 |
| S64b | RETURN TO S14b |

TARGET SUPPLY SYSTEM, EXTREME ULTRAVIOLET LIGHT GENERATION APPARATUS, AND ELECTRONIC DEVICE MANUFACTURING METHOD

The present application claims the benefit of Japanese Patent Application No. 2022-023467, filed on Feb. 18, 2022, the entire contents of which are hereby incorporated by reference.

BACKGROUND

1. Technical Field

The present disclosure relates to a target supply system, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, the development of an exposure apparatus that combines an extreme ultraviolet (EUV) light generation apparatus that generates EUV light having a wavelength of about 13 nm and reduced projection reflection optics is expected.

As the EUV light generation apparatus, a laser produced plasma (LPP) type apparatus using plasma generated by irradiating a target substance with pulse laser light has been developed.

LIST OF DOCUMENTS

Patent Documents

Patent Document 1: US Patent Application Publication No. 2021/0364927
Patent Document 2: Japanese Patent Application Publication No. 2010-123405
Patent Document 3: US Patent Application Publication No. 2016/0377986

SUMMARY

A target supply system according to an aspect of the present disclosure includes a load lock chamber configured to contain a solid target substance, a solid target supply pipe connected to the load lock chamber, a pressure regulator configured to regulate an externally supplied gas pressure, a gas pressure supply pipe connected to the pressure regulator, a melting tank connected to both the solid target supply pipe and the gas pressure supply pipe, and configured to melt the solid target substance supplied from the load lock chamber via the solid target supply pipe to generate a liquid target substance, a nozzle configured to discharge the liquid target substance by a gas pressure supplied from the pressure regulator to the melting tank via the gas pressure supply pipe, and a buffer tank configured to communicate with the melting tank and supply a gas pressure thereto when the solid target substance is supplied to the melting tank.

Further, an electronic device manufacturing method according to an aspect of the present disclosure includes generating extreme ultraviolet light using an extreme ultraviolet light generation apparatus, outputting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a target supply system; a laser device configured to irradiate, with pulse laser light, a target reaching a predetermined region after being output from the target supply system; and an EUV light concentrating mirror configured to concentrate the extreme ultraviolet light emitted from plasma generated in the predetermined region. The target supply system includes a load lock chamber configured to contain a solid target substance, a solid target supply pipe connected to the load lock chamber, a pressure regulator configured to regulate an externally supplied gas pressure, a gas pressure supply pipe connected to the pressure regulator, a melting tank connected to both the solid target supply pipe and the gas pressure supply pipe, and configured to melt the solid target substance supplied from the load lock chamber via the solid target supply pipe to generate a liquid target substance, a nozzle configured to discharge the liquid target substance by a gas pressure supplied from the pressure regulator to the melting tank via the gas pressure supply pipe, and a buffer tank configured to communicate with the melting tank and supply a gas pressure thereto when the solid target substance is supplied to the melting tank.

Further, an electronic device manufacturing method according to another aspect of the present disclosure includes inspecting a defect of a mask by irradiating the mask with extreme ultraviolet light generated using an extreme ultraviolet light generation apparatus, selecting a mask using a result of the inspection, and exposing and transferring a pattern formed on the selected mask onto a photosensitive substrate. Here, the extreme ultraviolet light generation apparatus includes a target supply system; a laser device configured to irradiate, with pulse laser light, a target reaching a predetermined region after being output from the target supply system; and an EUV light concentrating mirror configured to concentrate the extreme ultraviolet light emitted from plasma generated in the predetermined region. The target supply system includes a load lock chamber configured to contain a solid target substance, a solid target supply pipe connected to the load lock chamber, a pressure regulator configured to regulate an externally supplied gas pressure, a gas pressure supply pipe connected to the pressure regulator, a melting tank connected to both the solid target supply pipe and the gas pressure supply pipe, and configured to melt the solid target substance supplied from the load lock chamber via the solid target supply pipe to generate a liquid target substance, a nozzle configured to discharge the liquid target substance by a gas pressure supplied from the pressure regulator to the melting tank via the gas pressure supply pipe, and a buffer tank configured to communicate with the melting tank and supply a gas pressure thereto when the solid target substance is supplied to the melting tank.

BRIEF DESCRIPTION OF THE DRAWINGS

Embodiments of the present disclosure will be described below merely as examples with reference to the accompanying drawings.

FIG. 3 shows operation procedure of the target supply system according to the comparative example.

FIG. 7 shows operation procedure of the target supply system according to the first embodiment.

FIG. 17 shows operation procedure of the target supply system according to the fourth embodiment.

DESCRIPTION OF EMBODIMENTS

Contents

Figure 1:
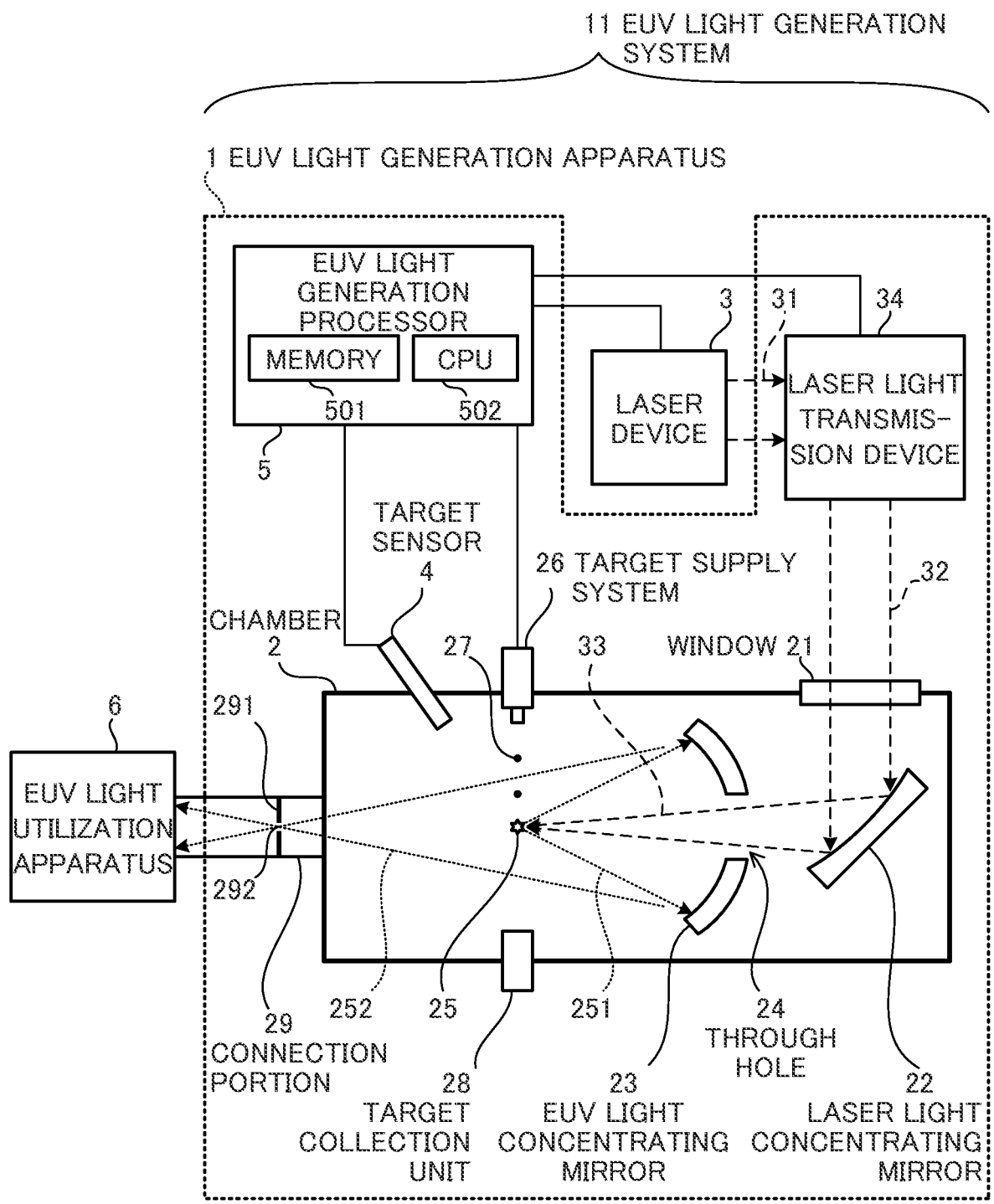
FIG. 1 schematically shows an exemplary configuration of an LPP EUV light generation system.

1. Overall description of EUV light generation system 11
 1.1 Configuration
 1.2 Operation
2. Comparative example
 2.1 Configuration
  2.1.1 Reservoir tank C1
  2.1.2 Load lock chamber C2
  2.1.3 Melting tank C3
  2.1.4 Various pipes
 2.2 Operation
 2.3 Problems of comparative example
3. Target supply system 261 in which buffer tank 64 is connected to gas pressure supply pipe L0
 3.1 Configuration
 3.2 Operation
 3.3 Temperature drop $\Delta T$ of gas in melting tank C3
 3.4 Gas pressure drop $\Delta P$ due to temperature drop $\Delta T$
 3.5 Effect
4. Target supply system 262 with removable melting tank C3
 4.1 Configuration
 4.2 Operation
 4.3 Effect
5. Variation of arrangement of buffer tank 64
 5.1 Configuration
 5.2 Operation
 5.3 Effect
6. Target supply system 264 which detects liquid level in melting tank C3
 6.1 Configuration
 6.2 Operation
 6.3 Effect
7. Others
 7.1 Pressure regulator 62
 7.2 EUV light utilization apparatus 6
 7.3 Supplementary Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. OVERALL DESCRIPTION OF EUV LIGHT GENERATION SYSTEM 11

1.1 Configuration

FIG. 1 schematically shows the configuration of an LPP EUV light generation system 11. An EUV light generation apparatus 1 is used together with a laser device 3. In the present disclosure, a system including the EUV light generation apparatus 1 and the laser device 3 is referred to as an EUV light generation system 11. The EUV light generation apparatus 1 includes a chamber 2 and a target supply system 26. The chamber 2 is a sealable container. The target supply system 26 supplies a target 27 containing a target substance into the chamber 2. The material of the target substance may include tin, terbium, gadolinium, lithium, xenon, or a combination of any two or more thereof.

A through hole is formed in a wall of the chamber 2. The through hole is blocked by a window 21 and pulse laser light 32 output from the laser device 3 passes through the window 21. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. A through hole 24 is formed at the center of the EUV light concentrating mirror 23, and pulse laser light 33 passes through the through hole 24.

The EUV light generation apparatus 1 includes an EUV light generation processor 5, a target sensor 4, and the like. The EUV light generation processor 5 is a processing device including a memory 501 in which a control program is stored and a central processing unit (CPU) 502 which executes the control program. The EUV light generation processor 5 is specifically configured or programmed to perform various processes included in the present disclosure. The target sensor 4 detects at least one of the presence, trajectory, position, and velocity of the target 27. The target sensor 4 may have an imaging function.

Further, the EUV light generation apparatus 1 includes a connection portion 29 providing communication between the internal space of the chamber 2 and the internal space of an EUV light utilization apparatus 6. An example of the EUV light utilization apparatus 6 will be described later with reference to FIGS. 19 and 20. A wall 291 in which an aperture is formed is arranged in the connection portion 29. The wall 291 is arranged such that the aperture is located at the second focal point of the EUV light concentrating mirror 23.

Further, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of the pulse laser light 32, and an actuator for adjusting the position, posture, and the like of the optical element.

1.2 Operation

Operation of the EUV light generation system 11 will be described with reference to FIG. 1. Pulse laser light 31 output from the laser device 3 enters, via the laser light transmission device 34, the chamber 2 through the window 21 as the pulse laser light 32. The pulse laser light 32 travels along a laser light path in the chamber 2, is reflected by the laser light concentrating mirror 22, and is radiated to the target 27 as the pulse laser light 33.

The target supply system 26 outputs the target 27 toward the plasma generation region 25 in the chamber 2. The target 27 is irradiated with the pulse laser light 33. The target 27 irradiated with the pulse laser light 33 is turned into plasma, and radiation light 251 is radiated from the plasma. EUV light contained in the radiation light 251 is reflected by the EUV light concentrating mirror 23 with higher reflectance than light in other wavelength ranges. Reflection light 252 including the EUV light reflected by the EUV light concentrating mirror 23 is concentrated at the intermediate focal point 292 and output to the EUV light utilization apparatus 6. Here, one target 27 may be irradiated with a plurality of pulses included in the pulse laser light 33.

The EUV light generation processor 5 controls the entire EUV light generation system 11. The EUV light generation processor 5 processes a detection result of the target sensor 4. Based on the detection result of the target sensor 4, the EUV light generation processor 5 controls the timing at which the target 27 is output, the output direction of the target 27, and the like. Further, the EUV light generation processor 5 controls an oscillation timing of the laser device 3, a travel direction of the pulse laser light 32, the concentration position of the pulse laser light 33, and the like. The above-described various kinds of control are merely examples, and other control may be added as necessary.

2. COMPARATIVE EXAMPLE

2.1 Configuration

Figure 2:
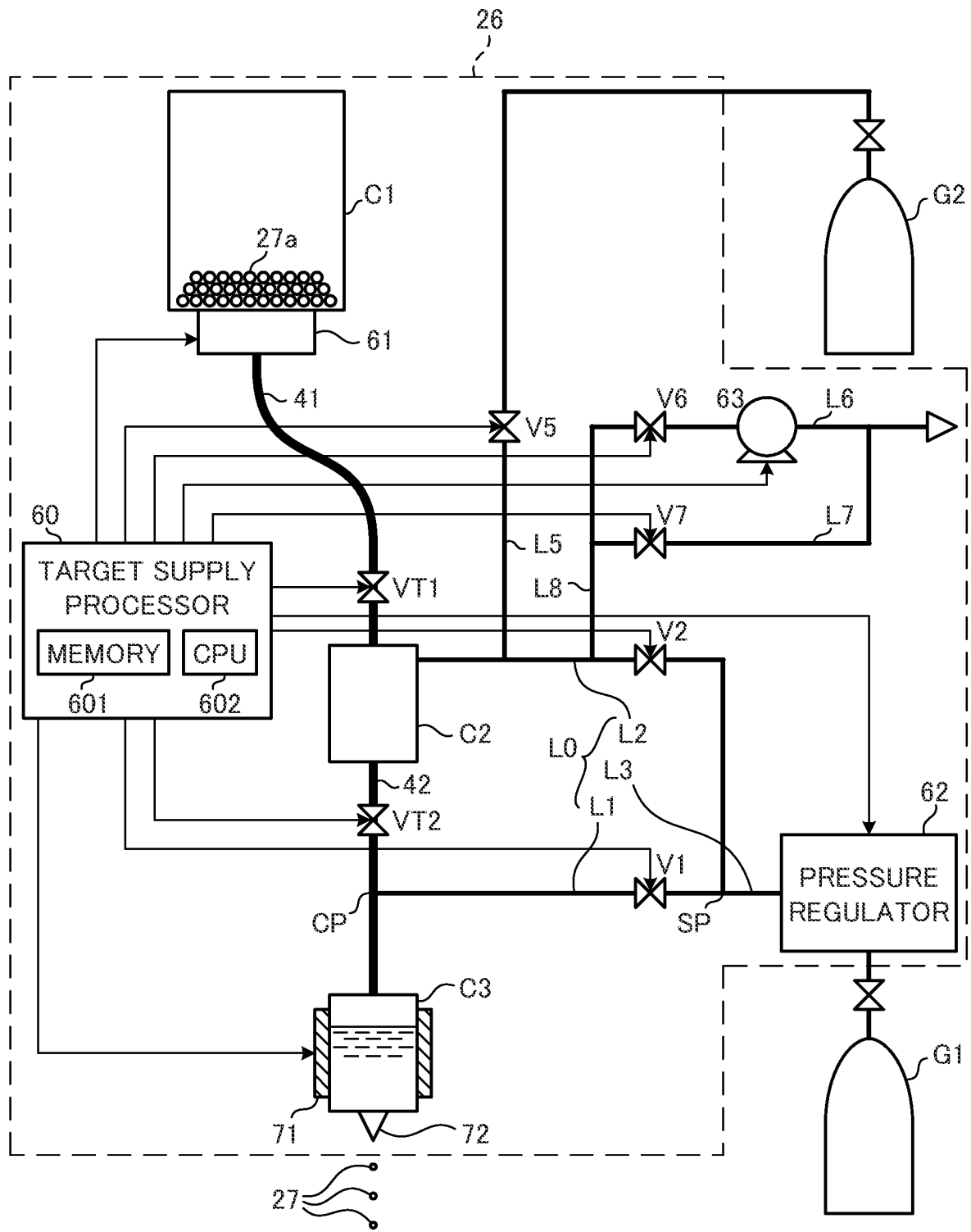
FIG. 2 schematically shows the configuration of a target supply system according to a comparative example.

FIG. 2 schematically shows the configuration of the target supply system 26 according to a comparative example. The comparative example of the present disclosure is an example recognized by the applicant as known only by the applicant, and is not a publicly known example admitted by the applicant. As shown in FIG. 2, the target supply system 26 according to the comparative example includes a reservoir tank C1, a load lock chamber C2, a melting tank C3, a target supply processor 60, solid target supply pipes 41, 42, a measuring instrument 61, a pressure regulator 62, and an exhaust pump 63.

The target supply processor 60 is a processing device including a memory 601 in which a control program is stored and a CPU 602 which executes the control program. The target supply processor 60 corresponds to the processor in the present disclosure. The target supply processor 60 is specifically configured or programmed to perform various processes included in the present disclosure.

2.1.1 Reservoir Tank C1

The reservoir tank C1 is a container containing the solid target substance 27a such as tin. The solid target substance 27a may be, for example, spherical particles of substantially the same size. Alternatively, the particles may have a shape other than a spherical shape. The temperature in the reservoir tank C1 is lower than the melting point of the target substance. The gas pressure in the reservoir tank C1 is substantially equal to the atmospheric pressure.

The measuring instrument 61 is arranged at the lower end of the reservoir tank C1. The reservoir tank C1 is connected to the solid target supply pipe 41 via the measuring instrument 61, and the solid target supply pipe 41 is connected to the load lock chamber C2. A solid target supply valve VT1 is arranged at the solid target supply pipe 41.

The measuring instrument 61 normally stops the supply of the solid target substance 27a to the solid target supply pipe 41.

The measuring instrument 61 can pass the solid target substance 27a supplied from the reservoir tank C1 to the load lock chamber C2 while measuring the amount of the solid target substance 27a. Measuring the amount of the solid target substance 27a includes counting the number of particles of the solid target substance 27a. The measured solid target substance 27a is moved by gravity to the load lock chamber C2 as passing through the solid target supply pipe 41 and the solid target supply valve VT1. After a predetermined amount of the solid target substance 27a passes, the measuring instrument 61 stops passing of the solid target substance 27a.

2.1.2 Load Lock Chamber C2

The load lock chamber C2 is a container configured to be capable of containing the solid target substance 27a supplied from the reservoir tank C1. The temperature in the load lock chamber C2 is lower than the melting point of the target substance. The load lock chamber C2 is connected to a common pipe L3 via a second pipe L2 and to the pressure regulator 62 via a common pipe L3. The pressure regulator 62 will be described later.

The load lock chamber C2 is connected to the solid target supply pipe 42, and the solid target supply pipe 42 is connected to the melting tank C3. A solid target supply valve VT2 is arranged at the solid target supply pipe 42. The solid target supply valve VT2 is normally closed to suppress the gas in the melting tank C3 from flowing toward the load lock chamber C2. The solid target supply valve VT2 is temporarily opened to supply the solid target substance 27a from the load lock chamber C2 to the melting tank C3.

2.1.3 Melting Tank C3

The melting tank C3 is a container to contain the target substance supplied from the load lock chamber C2 via the solid target supply pipe 42. The melting tank C3 is connected to the solid target supply pipe 42 and is connected to the first pipe L1 via a part of the solid target supply pipe 42. The melting tank C3 is connected to a common pipe L3 via a first pipe L1 and to the pressure regulator 62 via the common pipe L3. The pressure regulator 62 is connected to a gas cylinder G1 outside the target supply system 26. The gas cylinder G1 contains a high-pressure rare gas such as an argon gas or a helium gas as a pressurized gas. The pressure regulator 62 regulates the pressure of the gas supplied from the gas cylinder G1 and supplies the gas to the melting tank C3. The target supply processor 60 controls the pressure regulator 62, so that the gas pressure in the melting tank C3 is regulated to a predetermined gas pressure. The predetermined gas pressure is lower than the gas pressure supplied from the gas cylinder G1 and higher than the atmospheric pressure.

A heater 71 and a nozzle 72 are arranged at the melting tank C3. The heater 71 is connected to a power source (not shown) and heats the inside of the melting tank C3 to a predetermined temperature higher than the melting point of the target substance. The temperature in the melting tank C3 is controlled by controlling the power source based on the output of a temperature sensor (not shown) arranged at the melting tank C3. As a result, the solid target substance 27a is melted in the melting tank C3 to generate a liquid target substance.

The nozzle 72 is arranged at a lower end portion of the melting tank C3 in the gravity direction. The tip of the nozzle 72 is opened to the inside of the chamber 2 (see FIG. 1). The liquid target substance in the melting tank C3 is output from the opening at the tip of the nozzle 72 owing to the difference between the gas pressure supplied from the pressure regulator 62 and the gas pressure in the chamber 2. When vibration is applied to the nozzle 72 by a piezoelectric element (not shown), the jet-like liquid target substance output from the nozzle 72 is separated into droplets to form the targets 27.

2.1.4 Various Pipes

The first pipe L1, the second pipe L2, and the common pipe L3 constitute a gas pressure supply pipe L0. The first pipe L1 is a pipe between a branch portion SP and a connection portion CP to the solid target supply pipe 42, the second pipe L2 is a pipe between the branch portion SP and the load lock chamber C2, and the common pipe L3 is a pipe between the pressure regulator 62 and the branch portion SP. The connection portion CP is located in the solid target supply pipe 42 between the solid target supply valve VT2 and the melting tank C3.

A first gas pressure supply valve V1 is arranged at the first pipe L1. The first pipe L1 supplies the gas pressure from the branch portion SP toward the melting tank C3. A second gas pressure supply valve V2 is arranged at the second pipe L2. The second pipe L2 supplies the gas pressure from the branch portion SP toward the load lock chamber C2.

Although a case in which the first pipe L1 is connected to the melting tank C3 via a part of the solid target supply pipe 42 has been described here, the first pipe L1 may be directly connected to the melting tank C3 not via the solid target supply pipe 42.

A pipe L5 for purge gas supply and a pipe L8 for exhaust are connected to the second pipe L2 each at a position between the load lock chamber C2 and the second gas pressure supply valve V2.

The pipe L5 is connected to a gas cylinder G2 outside the target supply system 26. The gas cylinder G2 contains a rare gas such as an argon gas or a helium gas as the purge gas. The gas pressure in the gas cylinder G2 may be lower than the gas pressure in the gas cylinder G1, or even lower than the gas pressure regulated by the pressure regulator 62. The gas pressure in the gas cylinder G2 may be slightly higher than the atmospheric pressure. Alternatively, a pressure regulator (not shown) may be arranged at the pipe L5, and the gas pressure of the purge gas supplied from the gas cylinder G2 may be regulated to a pressure lower than the gas pressure regulated by the pressure regulator 62 and higher than the atmospheric pressure. A valve V5 is arranged at the pipe L5.

The pipe L8 is branched into a pipe L6 and a pipe L7. A valve V6 and the exhaust pump 63 are arranged at the pipe L6. A valve V7 is arranged at the pipe L7. The exhaust pump 63 is configured to forcibly exhaust the gas in the load lock chamber C2 so that the gas pressure in the load lock chamber C2 can be lower than the atmospheric pressure.

2.2 Operation

FIG. 3 shows operation procedure of the target supply system 26 according to the comparative example. The solid target substance 27a in the reservoir tank C1 is supplied to the melting tank C3 via the load lock chamber C2 in the following manner.

In S11, the operation starts from a state in which all of the solid target supply valves VT1, VT2, the first and second gas pressure supply valves V1, V2, and the valves V5 to V7 are closed. The heater 71 heats the inside of the melting tank C3 to a predetermined temperature higher than the melting point of the target substance.

In S12, the target supply processor 60 opens the first gas pressure supply valve V1. Thus, the gas pressure adjusted by the pressure regulator 62 is supplied to the melting tank C3, and the inside of the melting tank C3 is adjusted to a high pressure. Further, the target supply system 26 starts supply of the target 27, and consumption of the liquid target substance is started.

In S14, the target supply processor 60 waits until consumption of the liquid target substance proceeds as a certain time period elapses, and proceeds to the next step after the certain time elapses.

In S21, the target supply processor 60 opens the solid target supply valve VT1. In S22, the target supply processor 60 controls the measuring instrument 61 to measure a predetermined amount of the solid target substance 27a.

The measuring instrument 61 passes the solid target substance 27a while counting particles thereof one by one, and when a predetermined amount of the solid target substance 27a passes, passing of the solid target substance 27a is stopped. Thus, the solid target substance 27a is supplied to the load lock chamber C2.

In S23, the target supply processor 60 closes the solid target supply valve VT1. Thus, the solid target supply valve VT1 is opened before the measuring instrument 61 allows passing of the solid target substance, and is closed after the predetermined amount of the solid target substance 27a passes through the solid target supply valve VT1.

In S31, the target supply processor 60 activates the exhaust pump 63 and then opens the valve V6.

In S32, the target supply processor 60 closes the valve V6 and then stops the exhaust pump 63. The gas in the load lock chamber C2 is thereby exhausted to the outside.

In S33, the target supply processor 60 opens the valve V5 and then closes the valve V5. Thus, the purge gas is supplied to the inside of the load lock chamber C2 from the gas cylinder G2.

The processes of S31 to S33 may be performed only once, or the purity of the purge gas in the load lock chamber C2 may be increased by repeating the processes for a plurality of times.

In S41, the target supply processor 60 closes the first gas pressure supply valve V1. Thus, the gas pressure in the melting tank C3 when opening the second gas pressure supply valve V2 in S42 is suppressed from fluctuating rapidly.

When the first gas pressure supply valve V1 is closed, the gas pressure in the melting tank C3 decreases little by little. This is because the volume of the gas in the melting tank C3 increases in accordance with discharge of the liquid target substance from the nozzle 72 and decrease of the volume of the liquid target substance in the melting tank C3. However, after the first gas pressure supply valve V1 is closed, if the time until opening the first gas pressure supply valve V1 in S43 is short, the gas pressure in the melting tank C3 is suppressed from fluctuating greatly.

In S42, the target supply processor 60 opens the second gas pressure supply valve V2. Thus, the gas pressure regulated by the pressure regulator 62 is supplied to the load lock chamber C2, and the inside of the load lock chamber C2 is regulated to a high pressure. By regulating the inside of the load lock chamber C2 to a high pressure, the gas pressure in the melting tank C3 when opening the first gas pressure supply valve V1 in S43 is suppressed from fluctuating rapidly.

In S43, the target supply processor 60 opens the first gas pressure supply valve V1. When the first and second gas pressure supply valves V1, V2 are in an open state, the gas pressure in the load lock chamber C2 and the gas pressure in the melting tank C3 are substantially equal to each other.

In S51, the target supply processor 60 opens the solid target supply valve VT2. At this time, all of the solid target substance 27a in the load lock chamber C2 is supplied to the inside of the melting tank C3. Since the gas pressure in the load lock chamber C2 and the gas pressure in the melting tank C3 are substantially equal to each other due to S43, the fluctuation of the gas pressure in the melting tank C3 when the solid target supply valve VT2 is opened is small. The solid target substance 27a supplied to the melting tank C3 melts and mixes with the liquid target substance already contained and melted in the melting tank C3. The heater 71 suppresses a decrease in the internal temperature of the melting tank C3.

In S53, the target supply processor 60 closes the solid target supply valve VT2.

In S61, the target supply processor 60 closes the second gas pressure supply valve V2. Thus, the gas pressure in the melting tank C3 when opening the valve V7 in S62 is suppressed from fluctuating rapidly.

In S62, the target supply processor 60 opens the valve V7. Thus, the gas in the load lock chamber C2 is discharged to the outside of the target supply system 26, and the gas pressure in the load lock chamber C2 becomes substantially the same to the atmospheric pressure.

In S63, the target supply processor 60 closes the valve V7.

In S64, the target supply processor 60 returns to the process of S14.

According to the comparative example, the solid target substance 27a contained in the reservoir tank C1 having a substantially atmospheric pressure can be supplied into the melting tank C3 having a high pressure. Even when the liquid target substance in the melting tank C3 is consumed, the solid target substance 27a can be replenished without replacing the melting tank C3, so that the downtime of the EUV light generation apparatus 1 can be reduced.

2.3 Problems of Comparative Example

Figure 4:
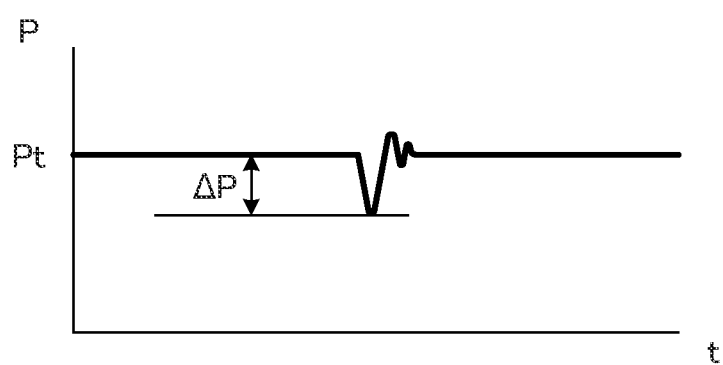
FIG. 4 is a graph showing a change in a gas pressure in a melting tank when a solid target substance is supplied from a load lock chamber to the melting tank.

FIG. 4 is a graph showing a change in a gas pressure P in the melting tank C3 when the solid target substance 27a is supplied from the load lock chamber C2 to the melting tank C3.

Since the gas pressure in the load lock chamber C2 and the gas pressure in the melting tank C3 are substantially equal to each other due to S43, the fluctuation of the gas pressure in the melting tank C3 when the solid target supply valve VT2 is opened in S51 is small. However, the surface temperature of the liquid target substance in the melting tank C3 may be decreased by the solid target substance 27a supplied to the melting tank C3 being melt. Due to this temperature change, the gas pressure P in the melting tank C3 may fluctuate. Although the gas pressure P is returned to a desired pressure by the control of the pressure regulator 62, it may take time until the gas pressure P stabilizes.

Figure 5:
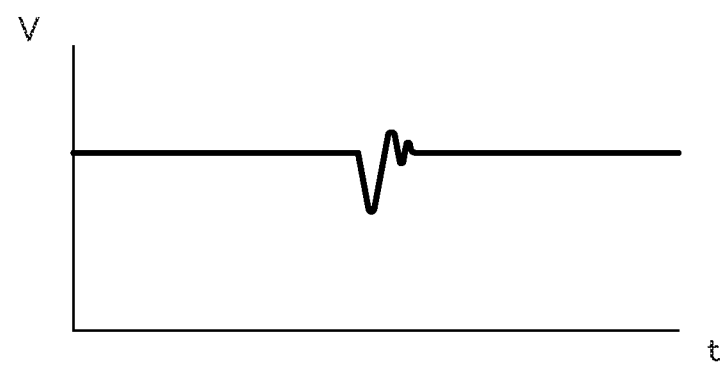
FIG. 5 is a graph showing a change in the velocity of a target when the change in the gas pressure shown in FIG. 4 occurs in the melting tank.

FIG. 5 is a graph showing a change in the velocity V of the target 27 when the change in the gas pressure P shown in FIG. 4 occurs in the melting tank C3. Since the liquid target substance is output from the nozzle 72 due to the difference between the pressure in the melting tank C3 and the pressure in the chamber 2, the velocity V of the target 27 also varies according to the variation of the gas pressure P in the melting tank C3. If the velocity V of the target 27 changes, since the position of the target 27 when the target is irradiated with the pulse laser light 33 (see FIG. 1) changes, the generation amount and the generation position of the plasma may vary. Thus, the characteristics such as the pulse energy and the intensity distribution of EUV light vary, and there is a case in which the stability of the quality of the EUV light is impaired.

In some embodiments described below, even when the surface temperature of the liquid target substance in the melting tank C3 decreases, the gas pressure P in the melting tank C3 is prevented from decreasing.

3. TARGET SUPPLY SYSTEM 261 IN WHICH BUFFER TANK 64 IS CONNECTED TO GAS PRESSURE SUPPLY PIPE L0

3.1 Configuration

Figure 6:
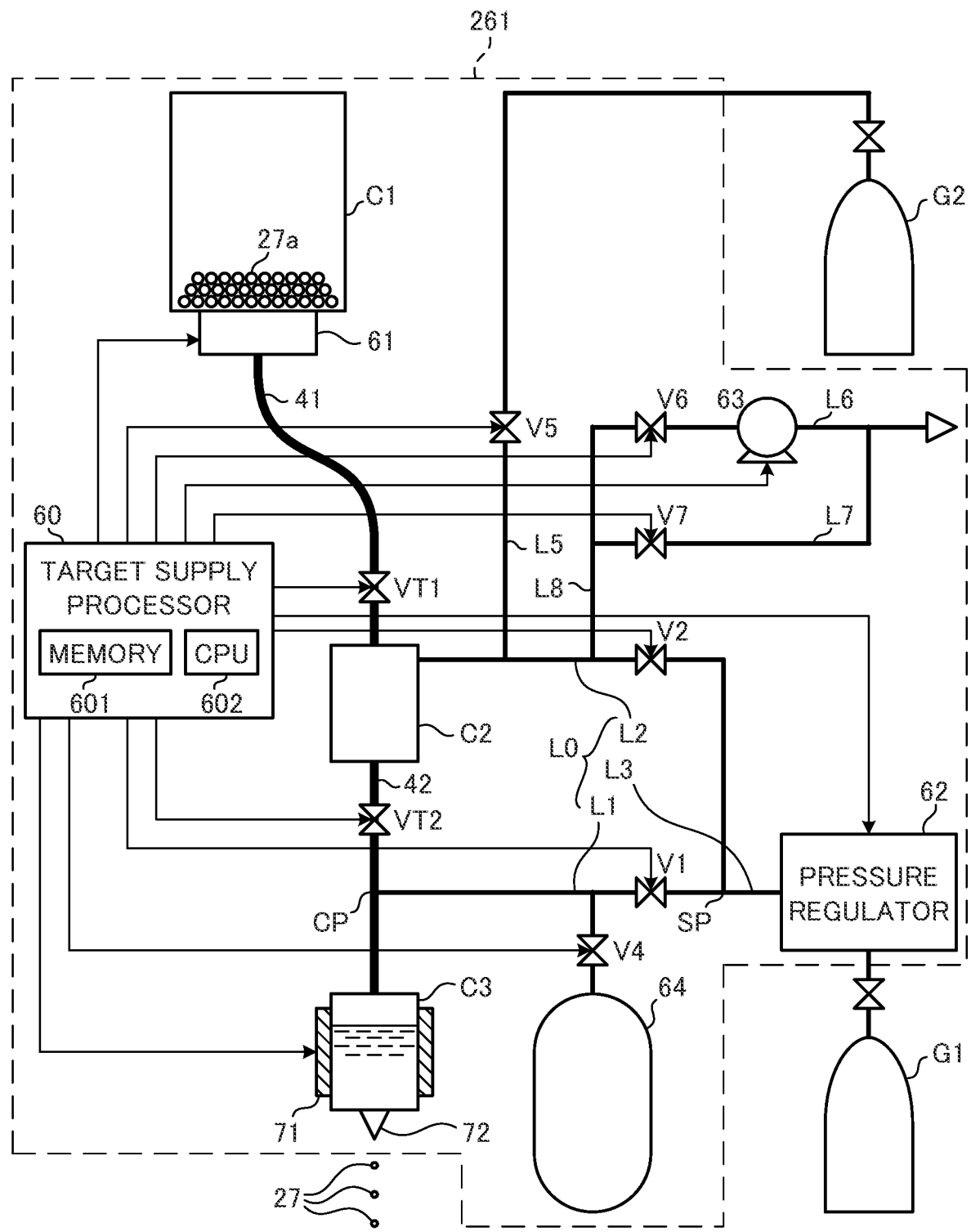
FIG. 6 schematically shows the configuration of the target supply system according to a first embodiment.

FIG. 6 schematically shows the configuration of a target supply system 261 according to a first embodiment. In addition to the configuration of the comparative example, the target supply system 261 includes a buffer tank 64. The composition of the gas in the buffer tank 64 may be the same as the composition of the gas contained in the gas cylinder G1.

The buffer tank 64 communicates with the melting tank C3 via the gas pressure supply pipe L0. The gas pressure supply path from the buffer tank 64 toward the melting tank C3 joins the first pipe L1 at the gas pressure supply path among the first pipe L1 from the first gas pressure supply valve V1 toward the melting tank C3. A valve V4 is arranged at a pipe connecting the buffer tank 64 to the first pipe L1.

The buffer tank 64 communicates with the melting tank C3 via the solid target supply pipe 42. The gas pressure supply path from the buffer tank 64 toward the melting tank C3 joins the solid target supply pipe 42 at the supply path of the solid target substance 27a among the solid target supply pipe 42 from the first solid target supply valve VT2 toward the melting tank C3. Therefore, when the solid target supply valve VT2 is closed, that is, even when the solid target substance 27a is not supplied to the melting tank C3 from the load lock chamber C2, the gas pressure fluctuation in the melting tank C3 is suppressed.

The buffer tank 64 contains a gas having temperature lower than that of the gas in the melting tank C3 when the target substance is heated in the melting tank C3 and the nozzle 72 discharges the liquid target substance. The gas temperature in the buffer tank 64 may be room temperature.

The buffer tank 64 contains a gas having a pressure higher than the atmospheric pressure and lower than the gas pressure supplied from the gas cylinder G1 to the pressure regulator 62. The gas pressure in the buffer tank 64 is equivalent to the gas pressure regulated by the pressure regulator 62.

3.2 Operation

FIG. 7 shows operation procedure of the target supply system 261 according to the first embodiment.

In S11a, the operation starts from a state in which the valve V4 is closed in addition to that all of the solid target supply valves VT1, VT2, the first and second gas pressure supply valves V1, V2, and the valves V5 to V7 are closed.

After the first gas pressure supply valve V1 is opened in S12, in S13a, the target supply processor 60 opens the valve V4 when the inside of the melting tank C3 reaches the target gas pressure. As a result, the buffer tank 64 communicates with the melting tank C3. Therefore, the buffer tank 64 communicates with the melting tank C3 even when the solid target substance 27a is supplied to the melting tank C3 in S51. Accordingly, even when the temperature of the gas in the melting tank C3 is lowered by supplying the solid target substance 27a to the melting tank C3, gas is quickly supplied from the buffer tank 64 to the melting tank C3, so that the change in the gas pressure in the melting tank C3 is suppressed. Here, the valve V4 may be always opened, or the valve V4 may be omitted. The operation in S14 to S64 is similar to that in the comparative example.

3.3 Temperature Drop ΔT of Gas in Melting Tank C3

A temperature drop $\Delta T$ of the gas in the melting tank C3 due to supplying the solid target substance 27a into the melting tank C3 can be calculated as follows. Here, as a first order approximation, a calculation example in a steady state is shown. That is, $\Delta T$ represents a temperature drop when the solid target substance 27a is supplied into the melting tank C3, all of the solid target substance 27a melts, and the liquid target substance and the gas present in the melting tank C3 are all at the same temperature. Here, the specific heat of the gas is not considered.

Figure 8:
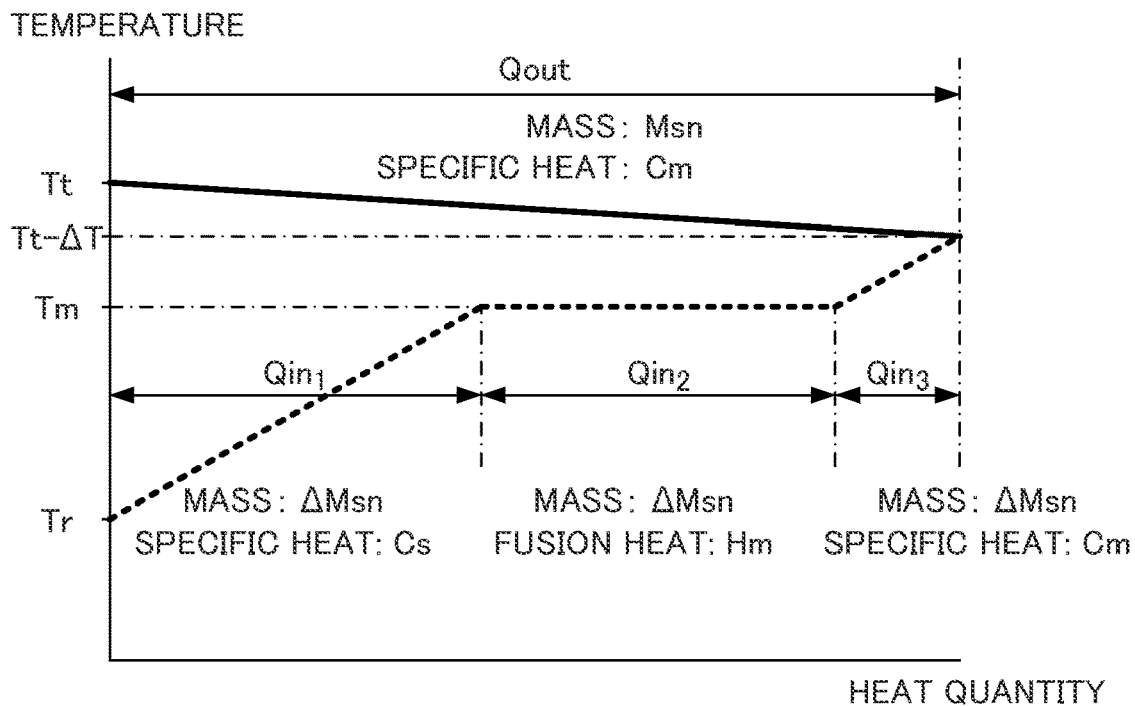
FIG. 8 is a graph showing a temperature change accompanying heat transfer after the solid target substance is supplied into the melting tank.

FIG. 8 is a graph showing a temperature change accompanying heat transfer after the solid target substance 27a is supplied into the melting tank C3.

The liquid target substance existing in the melting tank C3 before supplying the solid target substance 27a into the melting tank C3 is deprived of heat by the solid target substance 27a and reaches the temperature $Tt-\Delta T$ from the temperature Tt as shown by a thick solid line in FIG. 8.

On the other hand, the solid target substance 27a supplied into the melting tank C3 receives heat from the liquid target substance, is heated from the temperature Tr to reach a melting point Tm, and reaches the temperature $Tt-\Delta T$ after melting, as shown by a broken line in FIG. 8.

A heat quantity Qout of which the liquid target substance existing in the melting tank C3 before supplying the solid target substance 27a into the melting tank C3 is deprived from the solid target substance 27a is as follows.

$$Qout = \Delta T \cdot Msn \cdot Cm \qquad (a1)$$

Here, Msn is the mass of the liquid target substance existing in the melting tank C3 before supplying the solid target substance 27a into the melting tank C3.

Cm is the specific heat of the liquid target substance, and as the specific heat Cm, for example, 0.243 J/g which is the specific heat of liquid tin is used.

The heat quantity Qin received by the solid target substance 27a supplied into the melting tank C3 is the sum of the following heat quantities $Qin_1$ to $Qin_3$.

$Qin_1$: The heat quantity received by the solid target substance 27a supplied into the melting tank C3 until reaching the melting point Tm $$Qin_1 = (Tm - Tr) \cdot \Delta Msn \cdot Cs \qquad (a2)$$

As the melting point Tm of the target substance, for example, 505.13 K which is the melting point of tin is used.

As the temperature Tr of the solid target substance 27a before being supplied into the melting tank C3, for example, room temperature 293.2K is used.

$\Delta Msn$ is the mass of the solid target substance 27a supplied into the melting tank C3.

Cs is the specific heat of the solid target substance 27a supplied into the melting tank C3, and as the specific heat Cs, for example, 0.226 J/g which is the specific heat of solid tin is used.

$Qin_2$: The heat quantity received by the solid target substance 27a supplied into the melting tank C3 after reaching the melting point Tm and until melting $$Qin_2 = Hm \cdot \Delta Msn \qquad (a3)$$

Here, Hm is the fusion heat of the target substance, and as the fusion heat Hm, for example, 59.6 J/g which is the fusion heat of solid tin is used.

$Qin_3$: The heat quantity received by the solid target substance 27a supplied into the melting tank C3 until reaching the steady state $$Qin_3 = (Tt - \Delta T - Tm) \cdot \Delta Msn \cdot Cm \qquad (a4)$$

Temperature Tt of the liquid target substance before the solid target substance 27a is supplied into the melting tank C3 is assumed to be 533.9 K, for example. By subtracting the temperature drop $\Delta T$ from the temperature Tt, the temperature of the liquid target substance when reaching the steady state after the solid target substance 27a is supplied into the melting tank C3 is obtained, and by further subtracting the melting point Tm, the temperature change from the melting of the solid target substance 27a to the steady state is obtained.

According to the law of conservation of heat, since Qout and Qin are equal to each other, the following equation (a5) is established due to the equations (a1) to (a4).

$$\Delta T \cdot Msn \cdot Cm = (Tm - Tr) \cdot \Delta Msn \cdot Cs + Hm \cdot \Delta Msn + (Tt - \Delta T - Tm) \cdot \Delta Msn \cdot Cm \qquad (a5)$$

When the equation (a5) is rearranged, the temperature drop $\Delta T$ is obtained by the following equation (a6).

$$\Delta T = \Delta Msn \cdot \{(Tm - Tr) \cdot Cs + Hm + (Tt - Tm) \cdot Cm\} / \{(Msn + \Delta Msn) \cdot Cm\} \qquad (a6)$$

When Msn is sufficiently larger than ΔMsn, the temperature drop ΔT can be approximated as the following equation (a7).

$$\Delta T \approx \{(Tm-Tr)\cdot Cs/Cm + Hm/Cm + (Tt-Tm)\}\cdot \Delta Msn/Msn \quad (a7)$$

{(Tm−Tr)·Cs/Cm+Hm/Cm+(Tt−Tm)} included in the equation (a7) is a constant. Therefore, the temperature drop ΔT is substantially proportional to the ratio ΔMsn/Msn of the mass ΔMsn of the solid target substance 27a supplied into the melting tank C3 to the mass Msn of the liquid target substance existing in the melting tank C3 before the solid target substance 27a is supplied into the melting tank C3.

Figure 9:
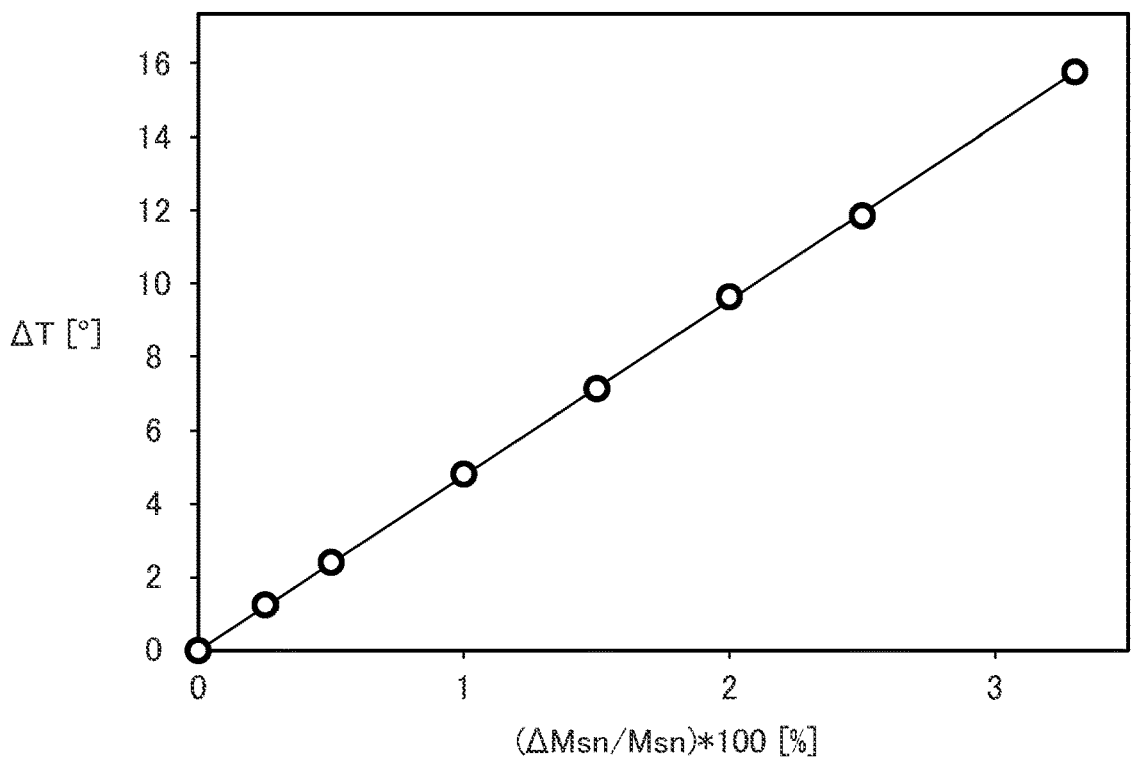
FIG. 9 is a graph showing a temperature drop as a function of a ratio $\Delta Msn/Msn$.

FIG. 9 is a graph showing the temperature drop ΔT as a function of the ratio ΔMsn/Msn. When the parameters included in the equation (a6) are replaced with specific numerical values and the temperature drop ΔT is plotted while changing the ratio ΔMsn/Msn in the range of 0% to 3.3%, the graph shown in FIG. 9 is obtained. The approximate equation of this graph is as follows:

$$\Delta T = 4.7618\cdot(\Delta Msn/Msn)\cdot 100$$

3.4 Gas Pressure Drop ΔP Due to Temperature Drop ΔT

A gas pressure drop ΔP in the melting tank C3 and the buffer tank 64 due to the temperature drop ΔT in the melting tank C3 can be calculated as follows. Here, as a first order approximation, a calculation example in a steady state is shown. That is, the gas pressure drop when the inside of the melting tank C3 and the buffer tank 64 becomes the same gas pressure P is represented by ΔP. However, it is assumed that the temperature of the gas in the buffer tank 64 does not change even when the temperature in the melting tank C3 drops, and is the same as the temperature Tr of the solid target substance 27a.

Figures 10, 11:
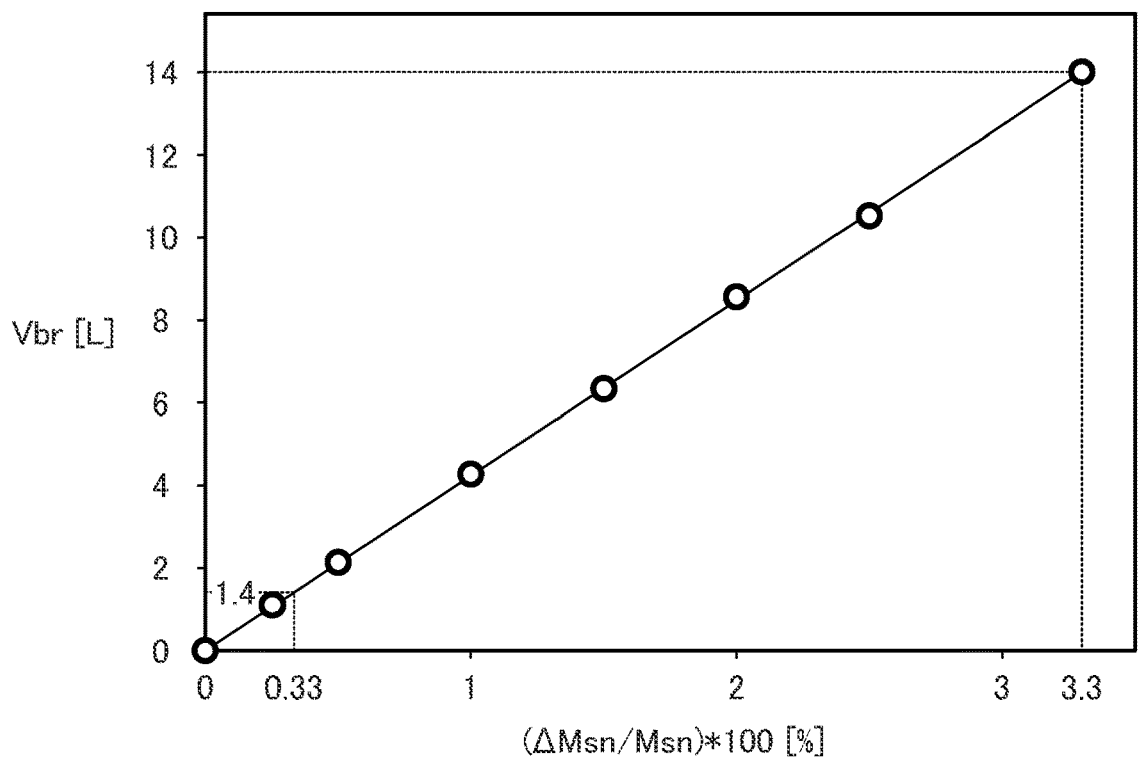
FIG. 10 shows a list of the gas pressure, volume, mol number, and temperature in each of the melting tank and a buffer tank before and after the temperature drop of the gas in the melting tank.
FIG. 11 is a graph showing the volume of the buffer tank as a function of the ratio $\Delta Msn/Msn$.

FIG. 10 shows a list of the gas pressure, volume, mol number, and temperature in each of the melting tank C3 and the buffer tank 64 before and after the temperature drop of the gas in the melting tank C3.

The state equation of the gas in the melting tank C3 before the temperature drop of the gas in the melting tank C3 is as follows.

$$Pt\cdot Vbh = n1\cdot R\cdot Tt \quad (b1)$$

Here, Pt is the target gas pressure of the pressure regulator 62.

Vbh is the volume of the gas in the melting tank C3. The volume Vbh of the gas in the melting tank C3 corresponds to the volume obtained by subtracting the volume of the liquid target substance in the melting tank C3 from the total volume of the melting tank C3.

Here, n1 is the mol number of the gas in the melting tank C3 before the temperature drop of the gas in the melting tank C3.

R is a gas constant.

The state equation of the gas in the melting tank C3 before the temperature drop of the gas in the buffer tank 64 is as follows.

$$Pt\cdot Vbr = n2\cdot R\cdot Tr \quad (b2)$$

Here, Vbr is the volume of the buffer tank 64.

Here, n2 is the mol number of the gas in the melting tank C3 before the temperature drop of the gas in the buffer tank 64.

From the equations (b1) and (b2), the total mol number n of the mol number n1 of the gas in the melting tank C3 and the mol number n2 of the gas in the buffer tank 64 is obtained by the following equation (b3).

$$n = Pt\cdot Vbh/(R\cdot Tt) + Pt\cdot Vbr/(R\cdot Tr) \quad (b3)$$

The state equation of the gas in the melting tank C3 after the temperature drop of the gas in the melting tank C3 is as follows.

$$P\cdot Vbh = n10\cdot R\cdot(Tt-\Delta T) \quad (b4)$$

Here, n10 is the mol number of the gas in the melting tank C3 after the temperature drop of the gas in the melting tank C3.

The state equation of the gas in the buffer tank 64 after the temperature drop of the gas in the melting tank C3 is as follows.

$$Pt\cdot Vbr = n20\cdot R\cdot Tr \quad (b5)$$

Here, n20 is the mol number of the gas in the buffer tank 64 after the temperature drop of the gas in the melting tank C3.

From the equations (b4) and (b5), the total mol number n of the mol number n10 of the gas in the melting tank C3 and the mol number n20 of the gas in the buffer tank 64 is given by the following equation (b6).

$$n = P\cdot Vbh/\{R\cdot(Tt-\Delta T)\} + P\cdot Vbr/(R\cdot Tr) \quad (b6)$$

The total mol number n is the same before and after the temperature drop of the gas in the melting tank C3.

From the equations (b3) and (b6), the gas pressure P in the melting tank C3 and the buffer tank 64 after the temperature drop is as shown by the following equation (b7).

$$P = \{Pt\cdot Vbh/(R\cdot Tt) + Pt\cdot Vbr/(R\cdot Tr)\}/[Vbh/\{R\cdot(Tt-\Delta T)\} + Vbr/(R\cdot Tr)] \quad (b7)$$

The gas pressure drop ΔP due to the temperature drop ΔT is obtained as the following equation (b8) by subtracting the gas pressure P of the equation (b7) from the target gas pressure Pt of the pressure regulator 62.

$$\Delta P = Pt - \{Pt\cdot Vbh/(R\cdot Tt) + Pt\cdot Vbr/(R\cdot Tr)\}/[Vbh/\{R\cdot(Tt-\Delta T)\} + Vbr/(R\cdot Tr)] \quad (b8)$$

Therefore, an allowable value of the gas pressure drop ΔP is set, and the volume Vbr of the buffer tank 64 which makes the gas pressure drop ΔP equal to or less than the allowable value can be calculated. From the equation (b8), the volume Vbr of the buffer tank 64 causing the gas pressure drop ΔP to be equal to or less than the allowable value depends on the temperature drop ΔT in the melting tank C3. From FIG. 9, since the temperature drop ΔT depends on the ratio ΔMsn/Msn, the volume Vbr of the buffer tank 64 causing the gas pressure drop ΔP to be equal to or less than the allowable value depends on the ratio ΔMsn/Msn.

FIG. 11 is a graph showing the volume Vbr of the buffer tank 64 as a function of the ratio ΔMsn/Msn. The volume Vbr of the buffer tank 64 causing the gas pressure drop ΔP to be equal to or less than the allowable value is given by the following equation.

$$Vbr = 4.2084\cdot(\Delta Msn/Msn)\cdot 100$$

Here, when the preferable range of the ratio ΔMsn/Msn is set to 0.33% or more and 3.3% or less, the volume Vbr of the buffer tank 64 is preferably 1.4 liters or more and 14 liters or less. The volume Vbr of the buffer tank 64 is preferably larger than the volume of the melting tank C3. The reason why the preferable range of the ratio ΔMsn/Msn is set to 0.33% or more and 3.3% or less is as follows. If the ratio ΔMsn/Msn is less than 0.33%, the lifetime of the solid target supply valve VT2 may be shortened because the solid target substance 27a needs to be supplied frequently. If the ratio ΔMsn/Msn is higher than 3.3%, the temperature drop ΔT of the liquid target substance in the melting tank C3 becomes large, and therefore, the generation of liquid droplets constituting the target 27 may become unstable.

3.5 Effect (1) According to the first embodiment, the target supply system 261 includes the load lock chamber C2, the solid target supply pipe 42, the pressure regulator 62, the gas pressure supply pipe L0, the melting tank C3, the nozzle 72, and the buffer tank 64. The load lock chamber C2 is configured to be capable of containing the solid target substance 27a. The solid target supply pipe 42 is connected to the load lock chamber C2. The pressure regulator 62 regulates the externally supplied gas pressure. The gas pressure supply pipe L0 is connected to the pressure regulator 62. The melting tank C3 is connected to both the solid target supply pipe 42 and the gas pressure supply pipe L0, and melts the solid target substance 27a supplied from the load lock chamber C2 via the solid target supply pipe 42 to generate the liquid target substance. The nozzle 72 discharges the liquid target substance by the gas pressure supplied from the pressure regulator 62 to the melting tank C3 via the gas pressure supply pipe L0. The buffer tank 64 is in communication with the melting tank C3 and supplies the gas pressure thereto when supplying the solid target substance 27a to the melting tank C3.

Accordingly, even when the temperature of the gas in the melting tank C3 is lowered when the solid target substance 27a is supplied to the melting tank C3, the gas in the buffer tank 64 communicating with the melting tank C3 is quickly supplied to the melting tank C3. Thus, the fluctuation of the gas pressure in the melting tank C3 can be suppressed. The velocity V of the target 27 can be stabilized by suppressing the fluctuation of the gas pressure in the melting tank C3.

(2) According to the first embodiment, the buffer tank 64 contains a gas having temperature lower than that of the gas in the melting tank C3 when the nozzle 72 discharges the liquid target substance.

Accordingly, since the buffer tank 64 does not need to be heated to the temperature of the melting tank C3, energy consumption can be suppressed.

(3) According to the first embodiment, the pressure regulator 62 supplies a gas pressure higher than the atmospheric pressure to the melting tank C3. The buffer tank 64 also contains a gas at a higher pressure than the atmospheric pressure.

Accordingly, since both the melting tank C3 and the buffer tank 64 contain the gas having a higher pressure than the atmospheric pressure, the fluctuation of the gas pressure in the melting tank C3 can be suppressed by the communication therebetween.

(4) According to the first embodiment, the pressure regulator 62 supplies a gas pressure to the melting tank C3 lower than the gas pressure externally supplied to the pressure regulator 62. The buffer tank 64 contains a gas having a pressure lower than the gas pressure externally supplied to the pressure regulator 62.

Accordingly, since both the melting tank C3 and the buffer tank 64 contain the gas having a lower pressure than the pressure externally supplied to the pressure regulator 62, the fluctuation of the gas pressure in the melting tank C3 can be suppressed by the communication therebetween.

(5) According to the first embodiment, the buffer tank 64 has a larger volume than the melting tank C3.

Accordingly, the fluctuation of the gas pressure in the melting tank C3 can be sufficiently suppressed.

(6) According to the first embodiment, the volume of the buffer tank 64 is in the range of 1.4 liters or more and 14 liters or less.

Accordingly, the fluctuation of the gas pressure in the melting tank C3 may be within an allowable range.

(7) According to the first embodiment, the buffer tank 64 communicates with the melting tank C3 via the gas pressure supply pipe L0.

Accordingly, separating the connection between the melting tank C3 and the pressure regulator 62 and separating the connection between the melting tank C3 and the buffer tank 64 can be realized by separating the gas pressure supply pipe L0 in the middle thereof. Thus, the workload for maintenance of the melting tank C3 can be reduced.

In the present disclosure, the buffer tank 64 is not limited to the case in which it communicates with the melting tank C3 via the solid target supply pipe 42. For example, the gas pressure supply pipe L0 may be directly connected to the melting tank C3 without through the solid target supply pipe 42 so that the buffer tank 64 communicates with the melting tank C3.

(8) According to the first embodiment, the buffer tank 64 communicates with the melting tank C3 via the solid target supply pipe 42.

Accordingly, if the heat insulation process is performed on the solid target supply pipe 42, another heat insulation process for the connection between the melting tank C3 and the buffer tank 64 may be unnecessary. Therefore, the configuration for heat insulation can be simplified.

In the present disclosure, the buffer tank 64 is not limited to the case in which it communicates with the melting tank C3 via the gas pressure supply pipe L0. For example, the buffer tank 64 may be directly connected to the solid target supply pipe 42 without through the gas pressure supply pipe L0 so that the buffer tank 64 communicates with the melting tank C3.

Further, in the present disclosure, the buffer tank 64 may directly communicate with the melting tank C3 without through both the gas pressure supply pipe L0 and the solid target supply pipe 42.

(9) According to the first embodiment, the solid target supply valve VT2 is arranged at the solid target supply pipe 42. Further, the gas pressure supply path from the buffer tank 64 toward the melting tank C3 joins the solid target supply pipe 42 at the supply path of the solid target substance 27a among the solid target supply pipe 42 from the first solid target supply valve VT2 toward the melting tank C3.

Accordingly, even in a state in which the solid target substance 27a is not supplied and the solid target supply valve VT2 is closed, the buffer tank 64 and the melting tank C3 are communicated with each other, so that the fluctuation of the gas pressure in the melting tank C3 can be suppressed.

(10) According to the first embodiment, the gas pressure supply pipe L0 includes the branch portion SP, the first pipe L1 for supplying the gas pressure from the branch portion SP toward the melting tank C3, the second pipe L2 for supplying the gas pressure from the branch portion SP toward the load lock chamber C2, and the common pipe L3 between the pressure regulator 62 and the branch portion SP. Further, the first and second gas pressure supply valves V1, V2 are arranged respectively at the first and second pipes L1, L2. The gas pressure supply path from the buffer tank 64 toward the melting tank C3 joins the first pipe L1 at the gas pressure supply path among the first pipe L1 from the first gas pressure supply valve V1 toward the melting tank C3.

Accordingly, even in a state in which the first gas pressure supply valve V1 for regulating the inside of the load lock chamber C2 to a high pressure is closed (see S41 to S43 in FIG. 7), the buffer tank 64 and the melting tank C3 are communicated with each other, so that the fluctuation of the gas pressure in the melting tank C3 can be suppressed.

In other respects, the first embodiment is similar to the comparative example.

4. TARGET SUPPLY SYSTEM 262 WITH REMOVABLE MELTING TANK C3

4.1 Configuration

Figure 12:
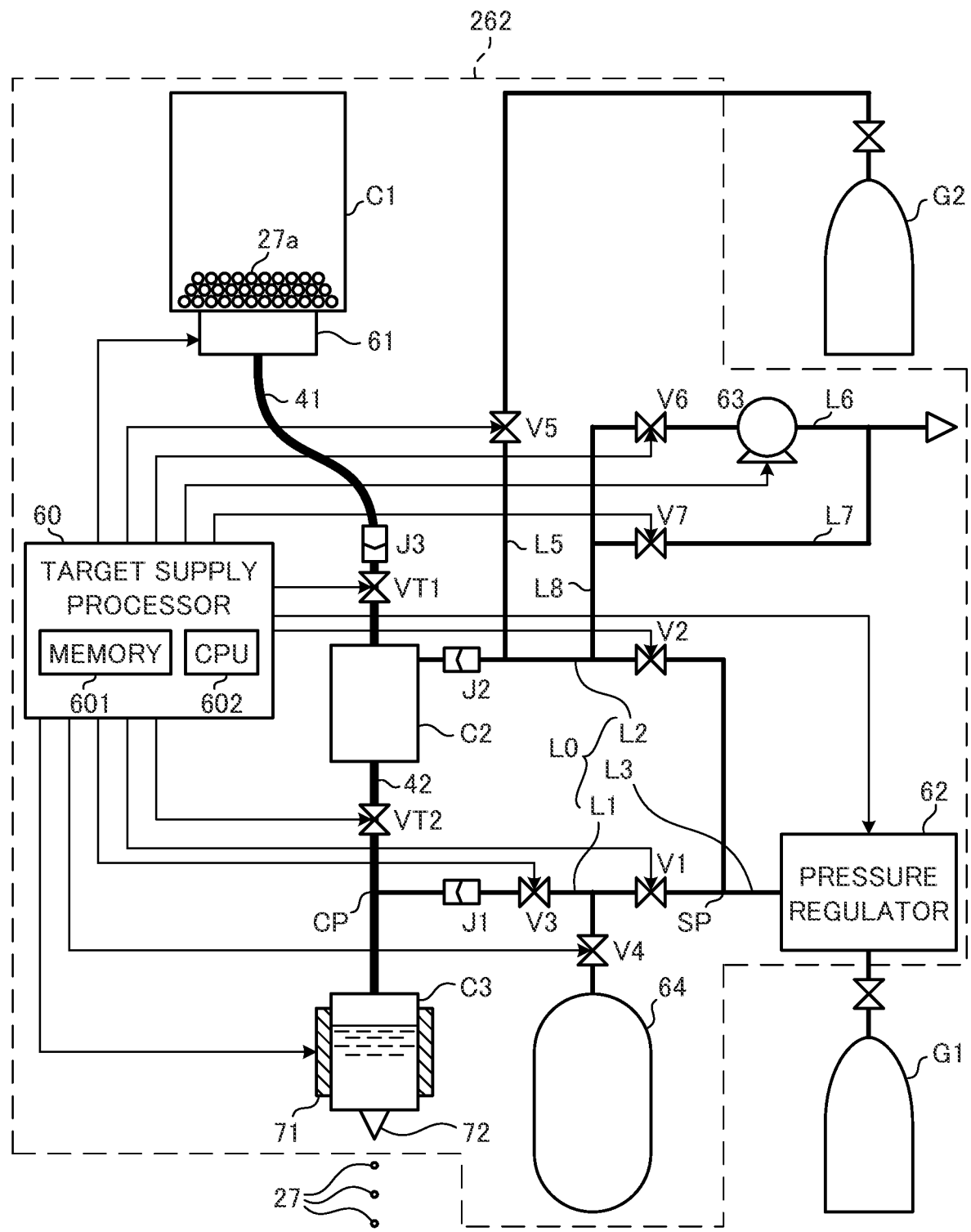
FIG. 12 schematically shows the configuration of the target supply system according to a second embodiment.

FIG. 12 schematically shows the configuration of a target supply system 262 according to a second embodiment. The target supply system 262 includes a third gas pressure supply valve V3 in addition to the configuration of the target supply system 261 according to the first embodiment.

Similarly to the first embodiment, the gas pressure supply pipe L0 includes the first pipe L1, the second pipe L2, and the common pipe L3. The first gas pressure supply valve V1 is arranged at the first pipe and the second gas pressure supply valve V2 is arranged at the second pipe L2. Further, the gas pressure supply path from the buffer tank 64 toward the melting tank C3 joins the first pipe L1 at the gas pressure supply path among the first pipe L1 from the first gas pressure supply valve V1 toward the melting tank C3.

In the second embodiment, the third gas pressure supply valve V3 is arranged, at the first pipe L1, at the gas pressure supply path toward the melting tank C3 from a joining position with the gas pressure supply path from the buffer tank 64.

The target supply system 262 further includes first to third joints J1 to J3.

The first joint J1 is arranged, at the first pipe L1, at the gas pressure supply path from the third gas pressure supply valve V3 toward the melting tank C3. The first joint J1 allows disconnection and connection in the middle of the first pipe L1.

The second joint J2 is arranged, at the second pipe L2, at the gas pressure supply path from the second gas pressure supply valve V2 toward the load lock chamber C2. The second joint J2 allows disconnection and connection in the middle of the second pipe L2.

The third joint J3 is arranged, at the solid target supply pipe 41, at the supply path of the solid target substance 27a from the measuring instrument 61 toward the solid target supply valve VT1. The third joint J3 allows disconnection and connection in the middle of the solid target supply pipe 41.

4.2 Operation

The melting tank C3 and the load lock chamber C2 can be collectively removed by disconnecting the respective pipes by the first to third joints J1 to J3. At this time, by keeping the third gas pressure supply valve V3 closed, the gas pressure in the buffer tank 64 can be maintained. The specific procedure is as follows.

(a) The power supply to the heater 71 is stopped.
(b) In a state in which the solid target supply valve VT1, the second and third gas pressure supply valves V2, V3, and the valves V5, V6 are closed, the solid target supply valve VT2 is opened and the valve V7 is opened. Thus the inside of the load lock chamber C2 and the melting tank C3 become the atmospheric pressure.
(c) The first to third joints J1 to J3 are loosened.
(d) The melting tank C3 and the load lock chamber C2 are collectively removed.

4.3 Effect

(11) According to the second embodiment, the gas pressure supply path from the buffer tank 64 toward the melting tank C3 joins the gas pressure supply pipe L0. Further, the third gas pressure supply valve V3 is arranged, at the gas pressure supply pipe L0, at the gas pressure supply path toward the melting tank C3 from the joining position with the gas pressure supply path from the buffer tank 64.

Accordingly, by keeping the third gas pressure supply valve V3 closed, it is possible to remove the melting tank C3 while maintaining the gas pressure in the buffer tank 64. Thus, it may not be necessary to refill the inside of the buffer tank 64 with the gas after a new melting tank C3 is mounted.

(12) According to the second embodiment, the gas pressure supply pipe L0 includes the branch portion SP, the first pipe L1 for supplying the gas pressure from the branch portion SP toward the melting tank C3, the second pipe L2 for supplying the gas pressure from the branch portion SP toward the load lock chamber C2, and the common pipe L3 between the pressure regulator 62 and the branch portion SP. Further, the first and second gas pressure supply valves V1, V2 are arranged respectively at the first and second pipes L1, L2. The gas pressure supply path from the buffer tank 64 toward the melting tank C3 joins the first pipe L1 at the gas pressure supply path among the first pipe L1 from the first gas pressure supply valve V1 toward the melting tank C3. The third gas pressure supply valve V3 is arranged, at the first pipe L1, at the gas pressure supply path toward the melting tank C3 from the joining position with the gas pressure supply path from the buffer tank 64.

Accordingly, even in a state in which the first gas pressure supply valve V1 for regulating the inside of the load lock chamber C2 to a high pressure is closed (see S41 to S43 in FIG. 7), the buffer tank 64 and the melting tank C3 are communicated with each other, so that the fluctuation of the gas pressure in the melting tank C3 can be suppressed.

Further, by keeping the third gas pressure supply valve V3 closed, it is possible to remove the melting tank C3 while maintaining the gas pressure in the buffer tank 64.

(13) According to the second embodiment, the target supply system 262 includes the measuring instrument 61 for measuring the solid target substance 27a and supplying it into the load lock chamber C2. Further, the first joint J1 is arranged, at the first pipe L1, at the gas pressure supply path from the third gas pressure supply valve V3 toward the melting tank C3. The second joint J2 is arranged, at the second pipe L2, at the gas pressure supply path from the second gas pressure supply valve V2 toward the load lock chamber C2. The third joint J3 is arranged at the supply path of the solid target substance 27a from the measuring instrument 61 toward the load lock chamber C2.

Accordingly, the melting tank C3 and the load lock chamber C2 can be integrally removed from the target supply system 262.

In other respects, the second embodiment is similar to the first embodiment.

5. VARIATION OF ARRANGEMENT OF BUFFER TANK 64

5.1 Configuration

Figure 13:
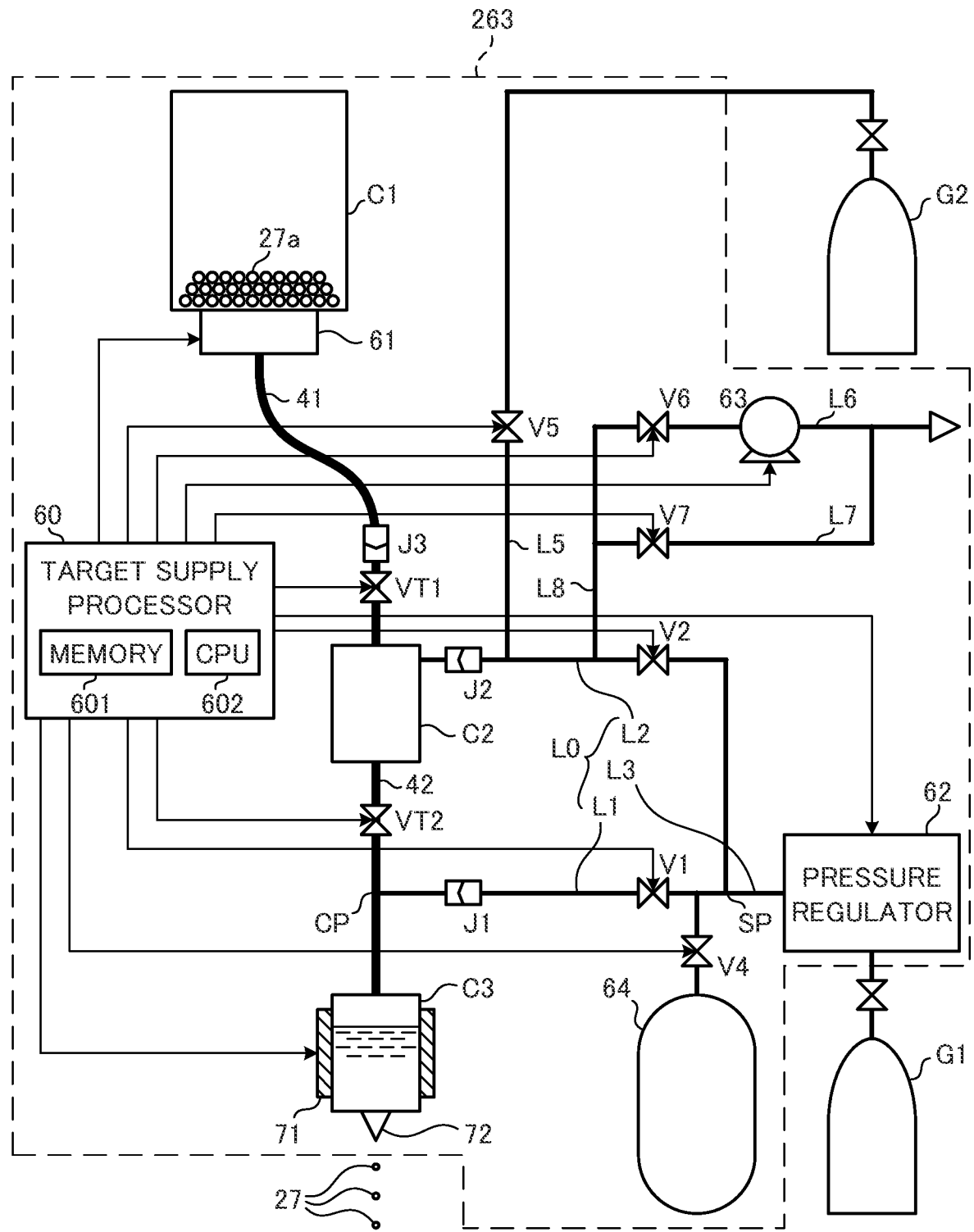
FIG. 13 schematically shows the configuration of the target supply system according to a third embodiment.

FIG. 13 schematically shows the configuration of a target supply system 263 according to a third embodiment. The target supply system 263 is different from the target supply system 261 according to the first embodiment in the arrangement of the buffer tank 64.

Similarly to the first embodiment, the gas pressure supply pipe L0 includes the first pipe L1, the second pipe L2, and the common pipe L3. The first gas pressure supply valve V1 is arranged at the first pipe and the second gas pressure supply valve V2 is arranged at the second pipe L2.

In the third embodiment, the gas pressure supply path from the buffer tank 64 to the melting tank C3 joins the gas pressure supply pipe L0 at any of the following (a) to (c);

(a) at the first pipe L1 between the branch portion SP and the first gas pressure supply valve V1;

(b) at the second pipe L2 between the branch portion SP and the second gas pressure supply valve V2; and (c) at the common pipe L3.

The target supply system 263 further includes the first to third joints J1 to J3. The first to third joints J1 to J3 are similar to those described in the second embodiment.

5.2 Operation

The melting tank C3 and the load lock chamber C2 can be collectively removed by disconnecting the respective pipes by the first to third joints J1 to J3. At this time, by keeping the first and second gas pressure supply valves V1, V2 closed, the gas pressure in the buffer tank 64 can be maintained.

5.3 Effect

(14) According to the third embodiment, the gas pressure supply pipe L0 includes the branch portion SP, the first pipe L1 for supplying the gas pressure from the branch portion SP toward the melting tank C3, the second pipe L2 for supplying the gas pressure from the branch portion SP toward the load lock chamber C2, and the common pipe L3 between the pressure regulator 62 and the branch portion SP. Further, the first and second gas pressure supply valves V1, V2 are arranged respectively at the first and second pipes L1, L2. The gas pressure supply path from the buffer tank 64 toward the melting tank C3 joins the gas pressure supply pipe L0 at any of the following;

(a) at the first pipe L1 between the branch portion SP and the first gas pressure supply valve V1;

(b) at the second pipe L2 between the branch portion SP and the second gas pressure supply valve V2; and (c) at the common pipe L3.

Accordingly, the buffer tank 64 can be arranged at a sufficient space away from the melting tank C3.

Further, by keeping the first and second gas pressure supply valves V1, V2 closed, it is possible to remove the melting tank C3 while maintaining the gas pressure in the buffer tank 64.

(15) According to the third embodiment, the target supply system 263 includes the measuring instrument 61 for measuring the solid target substance 27a and supplying it into the load lock chamber C2. Further, the first joint J1 is arranged, at the first pipe L1, at the gas pressure supply path from the first gas pressure supply valve V1 toward the melting tank C3. The second joint J2 is arranged, at the second pipe L2, at the gas pressure supply path from the second gas pressure supply valve V2 toward the load lock chamber C2. The third joint J3 is arranged at the supply path of the solid target substance 27a from the measuring instrument 61 toward the load lock chamber C2.

Accordingly, the melting tank C3 and the load lock chamber C2 can be integrally removed from the target supply system 263.

In other respects, the third embodiment is similar to the first embodiment.

6. TARGET SUPPLY SYSTEM 264 WHICH DETECTS LIQUID LEVEL IN MELTING TANK C3

6.1 Configuration

Figure 14:
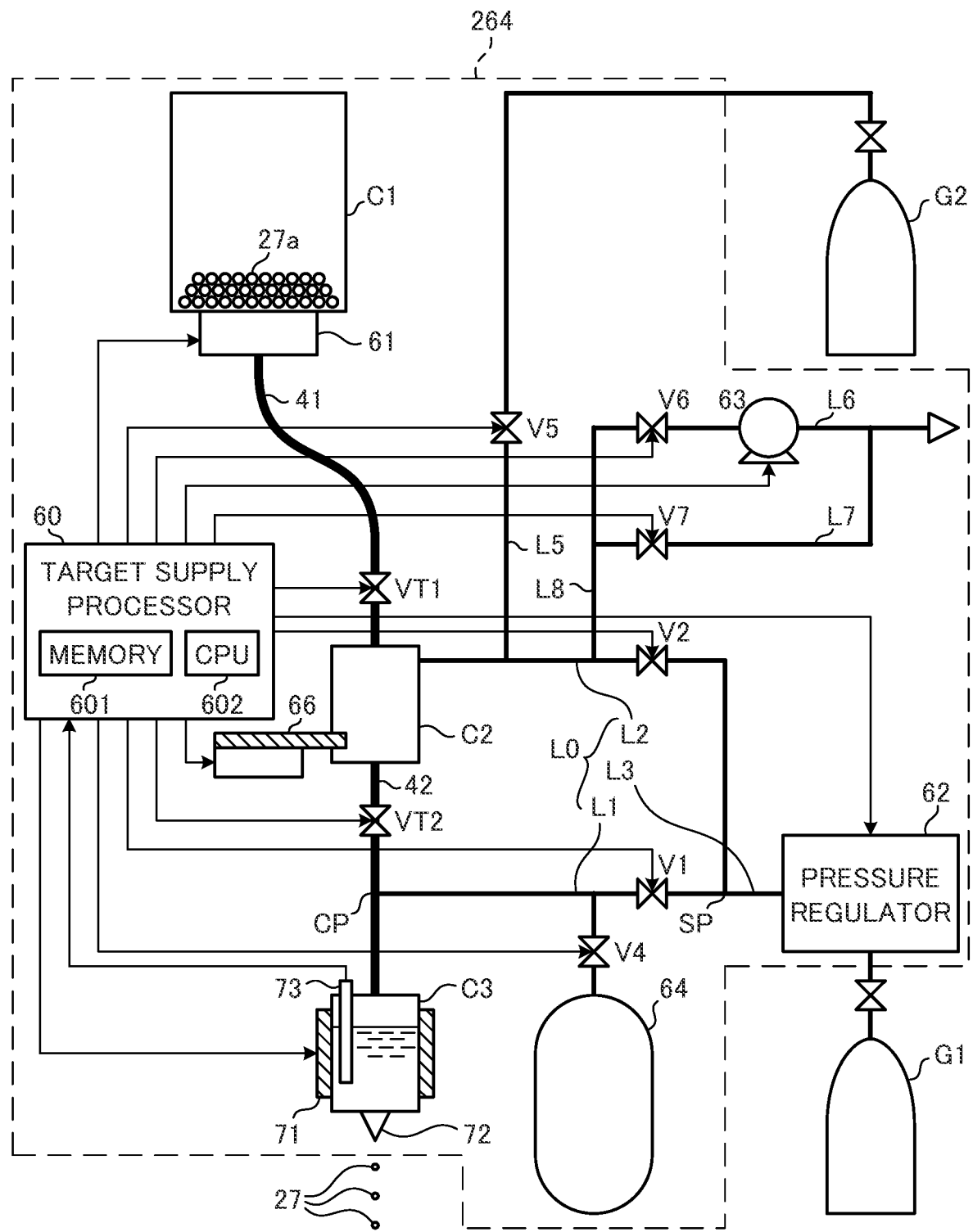
FIG. 14 schematically shows the configuration of the target supply system according to a fourth embodiment.

FIG. 14 schematically shows the configuration of a target supply system 264 according to a fourth embodiment. The target supply system 264 includes a sensor 73. The sensor 73 detects the liquid level position of the liquid target substance in the melting tank C3. When the sensor 73 detects that the liquid level position of the liquid target substance in the melting tank C3 is lower than a threshold value, the solid target substance 27a is to be supplied.

The target supply system 264 further includes an adjustment mechanism 66 for preventing the solid target substance 27a supplied to the load lock chamber C2 from reaching the solid target supply valve VT2.

Figure 15:
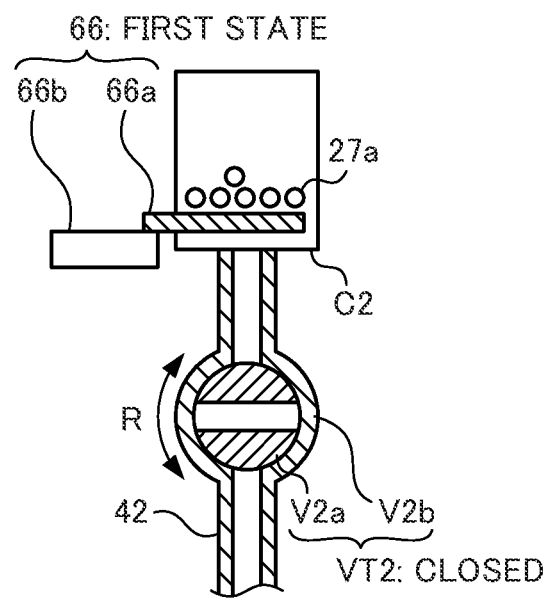
FIG. 15 shows the configuration of an adjustment mechanism and a solid target supply valve, and their operation is shown in combination with FIG. 16.
Figure 16:
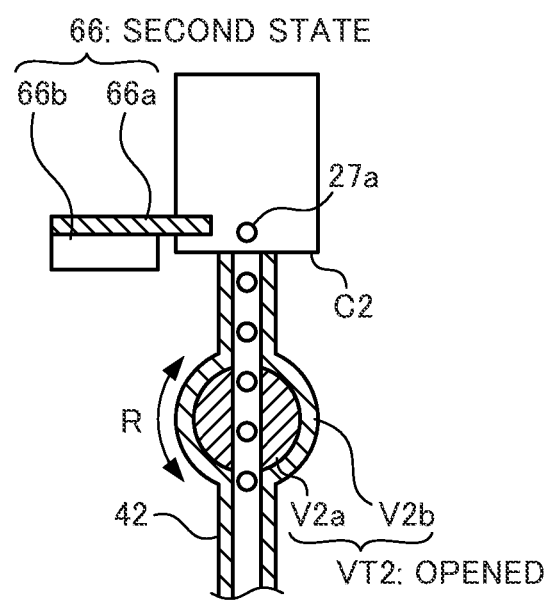
FIG. 16 shows the configuration of the adjustment mechanism and the solid target supply valve, and their operation is shown in combination with FIG. 15.

Each of FIGS. 15 and 16 shows the configuration of the adjustment mechanism 66 and the solid target supply valve VT2, and their operation is shown in combination of FIGS. 15 and 16.

The adjustment mechanism 66 includes a receiving plate 66a and an actuator 66b. The receiving plate 66a is located near the lower end of the load lock chamber C2. The actuator 66b is configured to switch the adjustment mechanism 66 between a first state shown in FIG. 15 and a second state shown in FIG. 16 by moving the receiving plate 66a.

In the first state, the receiving plate 66a is arranged to block a connecting portion between the load lock chamber C2 and the solid target supply pipe 42. Thus, the movement of the solid target substance 27a toward the solid target supply valve VT2 is suppressed.

In the second state, the receiving plate 66a is arranged at a position away from the connecting portion between the load lock chamber C2 and the solid target supply pipe 42. Thus, the movement of the solid target substance 27a toward the solid target supply valve VT2 is allowed.

The adjustment mechanism 66 is normally set in the first state, and is temporarily set in the second state when the solid target substance 27a is to be moved toward the solid target supply valve VT2.

The solid target supply valve VT2 includes, for example, a ball valve including a ball portion V2a and a body portion V2b. By rotating the ball portion V2a inside the body portion V2b in the direction of the arrow R, switching is performed between the closed state shown in FIG. 15 and the open state shown in FIG. 16.

6.2 Operation

FIG. 17 shows operation procedure of the target supply system 264 according to the fourth embodiment.

In S11b, the operation starts from a state in which the adjustment mechanism 66 is set in the first state in addition to that all of the solid target supply valves VT1, VT2, the first and second gas pressure supply valves V1, V2, and the valves V4 to V7 are closed.

After the first gas pressure supply valve V1 is opened in S12 and the valve V4 is opened in S13a, when the sensor 73 detects that the liquid level in the melting tank C3 is lower than a predetermined position in S14b, the target supply processor 60 proceeds to S21 and starts supplying the solid target substance 27a.

In S21 to S43, the solid target substance 27a is measured and supplied to the load lock chamber C2, and the inside of the load lock chamber C2 is regulated to a high pressure as in the first embodiment. However, based on the output of the sensor 73, the target supply processor 60 controls the measuring instrument 61 to supply the solid target substance 27a having a mass of 0.33% or more and 3.3% or less of the liquid target substance in the melting tank C3 to the load lock chamber C2.

When the solid target supply valve VT2 is opened in S51, since the adjustment mechanism 66 is set in the first state (see FIG. 15), the solid target substance 27a remains in the load lock chamber C2.

In S52b, the target supply processor 60 sets the adjustment mechanism 66 to the second state (see FIG. 16). Thus, the solid target substance 27a is supplied from the load lock chamber C2 to the melting tank C3 via the solid target supply pipe 42 and the solid target supply valve VT2. Since the adjustment mechanism 66 is set to the second state after the solid target supply valve VT2 is opened, damage to the solid target supply valve VT2 is suppressed.

After the solid target supply valve VT2 is closed in step S53, the target supply processor 60 sets the adjustment mechanism 66 to the first state in S54b. Therefore, even when the solid target substance 27a is supplied to the load lock chamber C2 again after returning to S14b in S64b, the solid target substance 27a remains in the load lock chamber C2. Steps S61 to S63 are similar to those in the comparative example.

6.3 Effect

(16) According to the fourth embodiment, the target supply system 264 includes the sensor 73 for detecting the liquid level of the liquid target substance in the melting tank C3 and the measuring instrument 61 for measuring the solid target substance 27a and supplying it into the load lock chamber C2. The target supply system 264 also includes the target supply processor 60 for controlling the measuring instrument 61 to supply the solid target substance 27a to the load lock chamber C2 based on the output of the sensor 73.

Accordingly, it is possible to appropriately control the supply timing or the supply amount of the solid target substance 27a.

(17) According to the fourth embodiment, based on the output of the sensor 73, the target supply processor 60 controls the measuring instrument 61 to supply the solid target substance 27a having a mass of 0.33% or more and 3.3% or less of the liquid target substance in the melting tank C3 to the load lock chamber C2.

Accordingly, by setting the mass to 0.33% or more, the frequency of use of the solid target supply valve VT2 can be reduced to suppress deterioration of the solid target supply valve VT2. By setting the mass to 3.3% or less, the temperature drop ΔT of the liquid target substance in the melting tank C3 can be suppressed, and the generation of liquid droplets constituting the target 27 can be stabilized.

In other respects, the fourth embodiment is similar to the first embodiment.

7. OTHERS

7.1 Pressure Regulator 62

Figure 18:
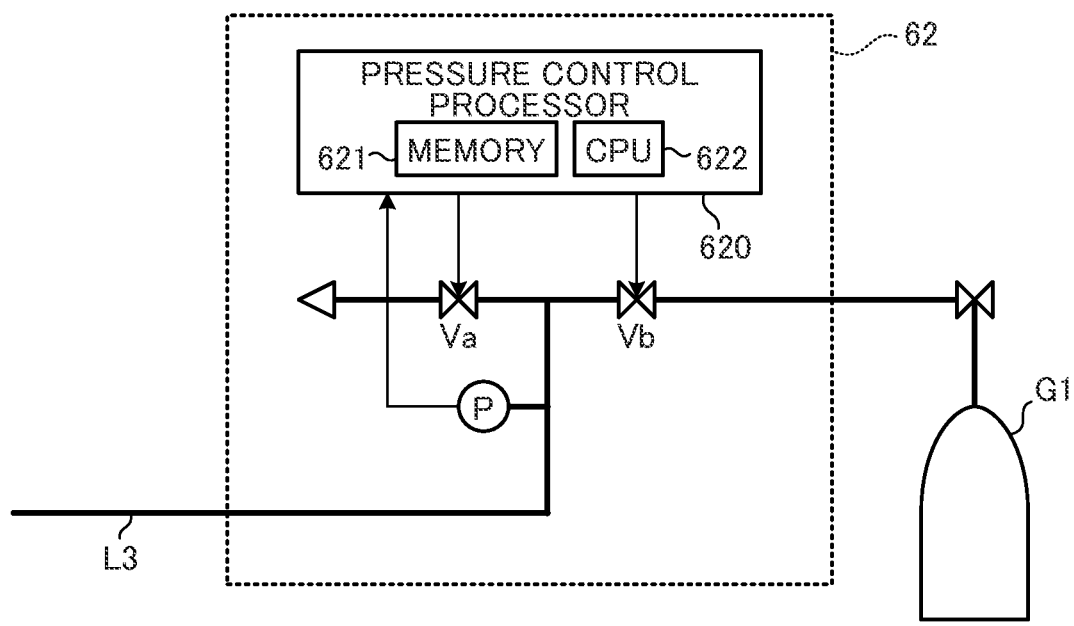
FIG. 18 schematically shows the configuration of a pressure regulator used in each embodiment.

FIG. 18 schematically shows the configuration of the pressure regulator 62 used in each embodiment. The pressure regulator 62 includes a pressure control processor 620, valves Va, Vb, and a pressure gauge P.

The pressure control processor 620 is a processor that includes a memory 621 in which a control program is stored and a CPU 622 which executes the control program. The pressure control processor 620 is specifically configured or programmed to perform various processes included in the present disclosure.

The valves Va, Vb are arranged at a pipe between the gas cylinder G1 and an exhaust device (not shown), and the common pipe L3 is connected between the valves Va, Vb. The pressure gauge P is arranged at the common pipe L3.

When both the valves Va, Vb are opened, the gas leaks from the gas cylinder G1 to the exhaust device, but the gas pressure supplied to the common pipe L3 changes in accordance with the relationship between the opening degree of the valve Va and the opening degree of the valve Vb. The pressure control processor 620 controls the valves Va, Vb based on the gas pressure detected by the pressure gauge P, so that the gas pressure supplied to the common pipe L3 can be regulated.

7.2 EUV Light Utilization Apparatus 6

Figure 19:
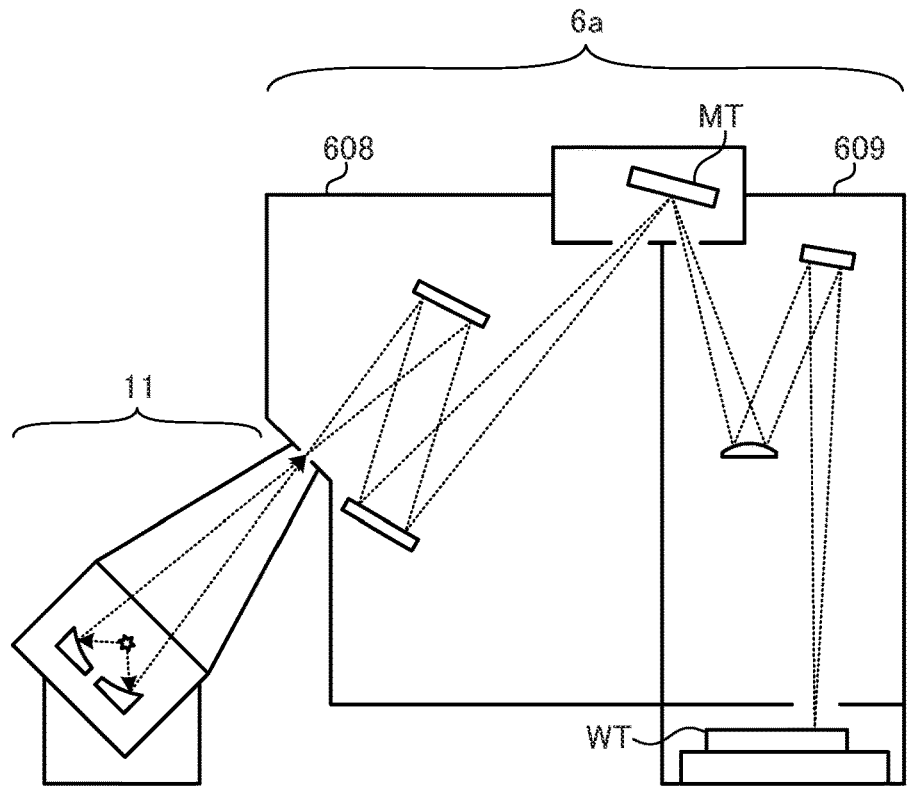
FIG. 19 schematically shows the configuration of an exposure apparatus connected to the EUV light generation system.

FIG. 19 schematically shows the configuration of an exposure apparatus 6a connected to the EUV light generation system 11.

In FIG. 19, the exposure apparatus 6a as the EUV light utilization apparatus 6 (see FIG. 1) includes a mask irradiation unit 608 and a workpiece irradiation unit 609. The mask irradiation unit 608 illuminates, via a reflection optical system, a mask pattern of a mask table MT with the EUV light incident from the EUV light generation system 11. The workpiece irradiation unit 609 images the EUV light reflected by the mask table MT onto a workpiece (not shown) arranged on a workpiece table WT via a reflection optical system. The workpiece is a photosensitive substrate such as a semiconductor wafer on which photoresist is applied. The exposure apparatus 6a synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

Figure 20:
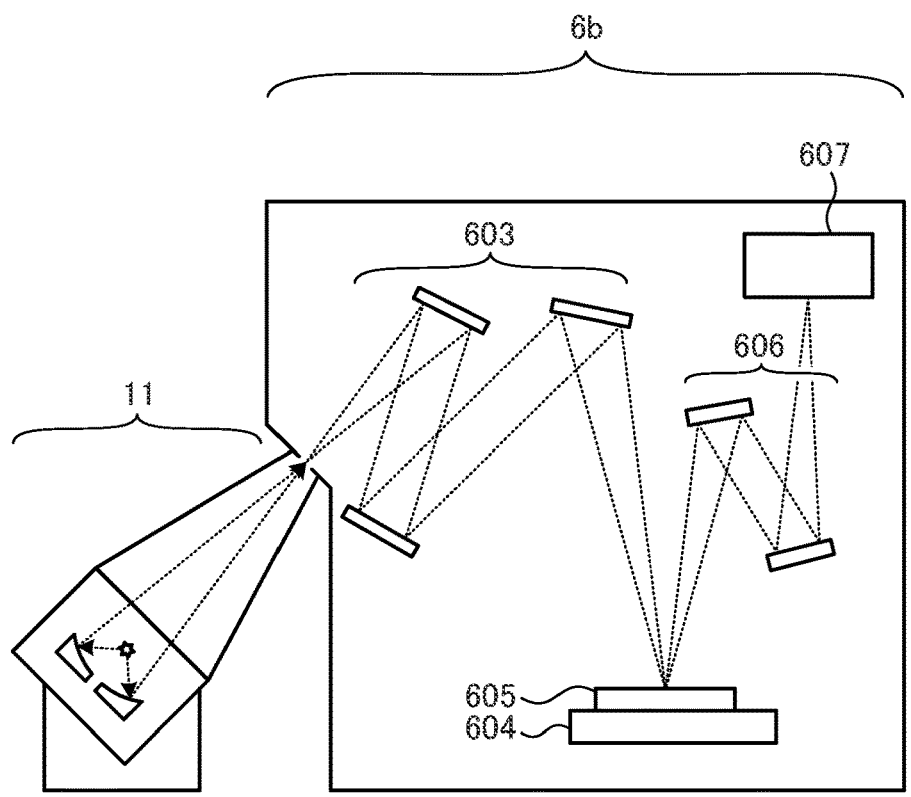
FIG. 20 schematically shows the configuration of an inspection apparatus connected to the EUV light generation system.

FIG. 20 schematically shows the configuration of an inspection apparatus 6b connected to the EUV light generation system 11.

In FIG. 20, the inspection apparatus 6b as the EUV light utilization apparatus 6 (see FIG. 1) includes an illumination optical system 603 and a detection optical system 606. The illumination optical system 603 reflects the EUV light incident from the EUV light generation system 11 to illuminate a mask 605 placed on a mask stage 604. Here, the mask 605 conceptually includes a mask blanks before a pattern is formed. The detection optical system 606 reflects the EUV light from the illuminated mask 605 and forms an image on a light receiving surface of a detector 607. The detector 607 having received the EUV light obtains the image of the mask 605. The detector 607 is, for example, a time delay integration (TDI) camera. Defects of the mask 605 are inspected based on the image of the mask 605 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 6a.

7.3 Supplementary

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A target supply system comprising:
a load lock chamber configured to contain a solid target substance;
a solid target supply pipe connected to the load lock chamber;
a pressure regulator configured to regulate an externally supplied gas pressure;
a gas pressure supply pipe connected to the pressure regulator;
a melting tank connected to both the solid target supply pipe and the gas pressure supply pipe, and configured to melt the solid target substance supplied from the load lock chamber via the solid target supply pipe to generate a liquid target substance;
a nozzle configured to discharge the liquid target substance by a gas pressure supplied from the pressure regulator to the melting tank via the gas pressure supply pipe; and
a buffer tank configured to communicate with the melting tank and supply a gas pressure thereto when the solid target substance is supplied to the melting tank,
wherein the gas pressure supply pipe includes a branch portion, a first pipe configured to supply a gas pressure from the branch portion toward the melting tank, a second pipe configured to supply a gas pressure from the branch portion toward the load lock chamber, and a common pipe between the pressure regulator and the branch portion,
first and second gas pressure supply valves are arranged respectively at the first and second pipes,
a gas pressure supply path from the buffer tank toward the melting tank joins the first pipe at a gas pressure supply path among the first pipe from the first gas pressure supply valve toward the melting tank, and
the buffer tank communicates with the load lock chamber via the first pipe and the second pipe when the solid target substance is supplied to the melting tank.

2. The target supply system according to claim 1, wherein the buffer tank contains a gas having temperature lower than that of the gas in the melting tank when the nozzle discharges the liquid target substance.

3. The target supply system according to claim 1, wherein the pressure regulator supplies a gas pressure higher than the atmospheric pressure to the melting tank, and
the buffer tank contains a gas having a pressure higher than the atmospheric pressure.

4. The target supply system according to claim 1, wherein the pressure regulator supplies a gas pressure to the melting tank lower than the gas pressure externally supplied to the pressure regulator, and
the buffer tank contains a gas having a pressure lower than the gas pressure externally supplied to the pressure regulator.

5. The target supply system according to claim 1, wherein the buffer tank has a larger volume than the melting tank.

6. The target supply system according to claim 1, wherein the volume of the buffer tank is in a range of 1.4 liters or more and 14 liters or less.

7. The target supply system according to claim 1, wherein the buffer tank communicates with the melting tank via the gas pressure supply pipe.

8. The target supply system according to claim 1, wherein the buffer tank communicates with the melting tank via the solid target supply pipe.

9. The target supply system according to claim 8, wherein a solid target supply valve is arranged at the solid target supply pipe, and
a gas pressure supply path from the buffer tank toward the melting tank joins the solid target supply pipe at a supply path of the solid target substance among the solid target supply pipe from the solid target supply valve toward melting tank.

10. An EUV light generation apparatus, comprising:
the target supply system according to claim 1;
a laser device configured to irradiate, with pulse laser light, a target reaching a predetermined region after being output from the target supply system; and
an EUV light concentrating mirror configured to concentrate extreme ultraviolet light emitted from plasma generated in the predetermined region.

11. The target supply system according to claim 1, wherein the first and second gas pressure supply valves are open when the solid target substance is supplied to the melting tank.

12. The target supply system according to claim 1, wherein the buffer tank communicates with the load lock chamber via the first pipe and the solid target supply pipe when the solid target substance is supplied to the melting tank.

13. An electronic device manufacturing method, comprising:
generating extreme ultraviolet light using an extreme ultraviolet light generation apparatus;
outputting the extreme ultraviolet light to an exposure apparatus; and
exposing a photosensitive substrate to the extreme ultraviolet light in the exposure apparatus to manufacture an electronic device,
the extreme ultraviolet light generation apparatus including:
a target supply system;
a laser device configured to irradiate, with pulse laser light, a target reaching a predetermined region after being output from the target supply system; and an EUV light concentrating mirror configured to concentrate the extreme ultraviolet light emitted from plasma generated in the predetermined region, and the target supply system including:
a load lock chamber configured to contain a solid target substance;
a solid target supply pipe connected to the load lock chamber;
a pressure regulator configured to regulate an externally supplied gas pressure;
a gas pressure supply pipe connected to the pressure regulator;
a melting tank connected to both the solid target supply pipe and the gas pressure supply pipe, and configured to melt the solid target substance supplied from the load lock chamber via the solid target supply pipe to generate a liquid target substance;
a nozzle configured to discharge the liquid target substance by a gas pressure supplied from the pressure regulator to the melting tank via the gas pressure supply pipe; and
a buffer tank configured to communicate with the melting tank and supply a gas pressure thereto when the solid target substance is supplied to the melting tank,
wherein the gas pressure supply pipe includes a branch portion, a first pipe configured to supply a gas pressure from the branch portion toward the melting tank, a second pipe configured to supply a gas pressure from the branch portion toward the load lock chamber, and a common pipe between the pressure regulator and the branch portion,
first and second gas pressure supply valves are arranged respectively at the first and second pipes,
a gas pressure supply path from the buffer tank toward the melting tank joins the first pipe at a gas pressure supply path among the first pipe from the first gas pressure supply valve toward the melting tank, and
the buffer tank communicates with the load lock chamber via the first pipe and the second pipe when the solid target substance is supplied to the melting tank.

14. The electronic device manufacturing method according to claim 13,
wherein the first and second gas pressure supply valves are open when the solid target substance is supplied to the melting tank.

15. The electronic device manufacturing method according to claim 13,
wherein the buffer tank communicates with the load lock chamber via the first pipe and the solid target supply pipe when the solid target substance is supplied to the melting tank.

16. An electronic device manufacturing method, comprising:
inspecting a defect of a mask by irradiating the mask with extreme ultraviolet light generated using an extreme ultraviolet light generation apparatus;
selecting a mask using a result of the inspection; and
exposing and transferring a pattern formed on the selected mask onto a photosensitive substrate,
the extreme ultraviolet light generation apparatus including:
a target supply system;
a laser device configured to irradiate, with pulse laser light, a target reaching a predetermined region after being output from the target supply system; and
an EUV light concentrating mirror configured to concentrate the extreme ultraviolet light emitted from plasma generated in the predetermined region, and
the target supply system including:
a load lock chamber configured to contain a solid target substance;
a solid target supply pipe connected to the load lock chamber;
a pressure regulator configured to regulate an externally supplied gas pressure;
a gas pressure supply pipe connected to the pressure regulator;
a melting tank connected to both the solid target supply pipe and the gas pressure supply pipe, and configured to melt the solid target substance supplied from the load lock chamber via the solid target supply pipe to generate a liquid target substance;
a nozzle configured to discharge the liquid target substance by a gas pressure supplied from the pressure regulator to the melting tank via the gas pressure supply pipe; and
a buffer tank configured to communicate with the melting tank and supply a gas pressure thereto when the solid target substance is supplied to the melting tank,
wherein the gas pressure supply pipe includes a branch portion, a first pipe configured to supply a gas pressure from the branch portion toward the melting tank, a second pipe configured to supply a gas pressure from the branch portion toward the load lock chamber, and a common pipe between the pressure regulator and the branch portion,
first and second gas pressure supply valves are arranged respectively at the first and second pipes,
a gas pressure supply path from the buffer tank toward the melting tank joins the first pipe at a gas pressure supply path among the first pipe from the first gas pressure supply valve toward the melting tank, and
the buffer tank communicates with the load lock chamber via the first pipe and the second pipe when the solid target substance is supplied to the melting tank.

17. The electronic device manufacturing method according to claim 16,
wherein the first and second gas pressure supply valves are open when the solid target substance is supplied to the melting tank.

18. The electronic device manufacturing method according to claim 16,
wherein the buffer tank communicates with the load lock chamber via the first pipe and the solid target supply pipe when the solid target substance is supplied to the melting tank.

\* \* \* \* \*